(12) United States Patent
Kim et al.

(10) Patent No.: US 8,982,083 B2
(45) Date of Patent: Mar. 17, 2015

(54) TOUCH SENSOR INTEGRATED TYPE DISPLAY DEVICE AND METHOD OF MANUFACTURING THE SAME

(71) Applicant: LG Display Co., Ltd., Seoul (KR)

(72) Inventors: Cheolse Kim, Daegu (KR); Juhan Kim, Bucheon-si (KR); Manhyeop Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 117 days.

(21) Appl. No.: 13/913,857

(22) Filed: Jun. 10, 2013

(65) Prior Publication Data

US 2013/0328812 A1    Dec. 12, 2013

(30) Foreign Application Priority Data

Jun. 11, 2012 (KR) .................. 10-2012-0062091
Dec. 7, 2012 (KR) .................. 10-2012-0141748

(51) Int. Cl.

| G06F 3/041 | (2006.01) |
| H01L 33/42 | (2010.01) |
| G06F 3/044 | (2006.01) |
| G02F 1/1333 | (2006.01) |
| G02F 1/1343 | (2006.01) |

(52) U.S. Cl.
CPC .............. *G06F 3/0412* (2013.01); *H01L 33/42* (2013.01); *G06F 3/044* (2013.01); *G02F 1/13338* (2013.01); *G02F 2001/134372* (2013.01); *G06F 2203/04103* (2013.01)

USPC ......................................................... 345/173

(58) Field of Classification Search
USPC ......................................................... 345/173
See application file for complete search history.

(56) References Cited

U.S. PATENT DOCUMENTS

| 8,576,153 | B2 * | 11/2013 | Park et al. ................. 345/96 |
| 2007/0035675 | A1 * | 2/2007 | Um et al. ................. 349/43 |
| 2011/0148743 | A1 * | 6/2011 | Kuo et al. ................. 345/55 |
| 2013/0328812 | A1 * | 12/2013 | Kim et al. ................. 345/173 |
| 2014/0015739 | A1 * | 1/2014 | Tsao et al. ................. 345/87 |
| 2014/0168150 | A1 * | 6/2014 | Kim et al. ................. 345/174 |

* cited by examiner

*Primary Examiner* — Van Chow
(74) *Attorney, Agent, or Firm* — Brinks Gilson & Lione

(57) ABSTRACT

A display device includes a plurality of first electrodes arranged on a substrate in parallel in a first direction; a plurality of second electrodes arranged in parallel in the first direction and a second direction crossing the first direction without contacting with the plurality of first electrodes; a plurality of first connecting wires, each first connecting wire being connected with at least one of the plurality of the first electrodes; and a plurality of second connecting wires, each second connecting wire connecting the second electrodes to each other in the second direction, wherein a touch driving voltage is supplied to the plurality of first connecting wires and a common voltage is supplied to the plurality of second connecting wires so that mutual capacitance is generated between the a plurality of first electrodes and the plurality of second electrodes.

20 Claims, 19 Drawing Sheets

R, G sub-pixel area

B sub-pixel area

R, G sub-pixel area

B sub-pixel area

R, G sub-pixel area

B sub-pixel area

R, G sub-pixel area

B sub-pixel area

R, G sub-pixel area

B sub-pixel area

R, G sub-pixel area

B sub-pixel area

R, G sub-pixel area

B sub-pixel area

R, G sub-pixel area

B sub-pixel area

R, G sub-pixel area

B sub-pixel area

R, G sub-pixel area

B sub-pixel area

R, G sub-pixel area

B sub-pixel area

R, G sub-pixel area

B sub-pixel area

R, G sub-pixel area

B sub-pixel area

TOUCH SENSOR INTEGRATED TYPE DISPLAY DEVICE AND METHOD OF MANUFACTURING THE SAME

PRIORITY CLAIM

This application claims the benefit of priority under 35 U.S.C. §119(a) to Korean Patent Application No. 10-2012-0062091 filed on Jun. 11, 2012 and Korean Patent Application No. 10-2012-0141748 filed on Dec. 7, 2012, the contents of each of which are incorporated by reference herein in their entirety.

FIELD OF THE INVENTION

This disclosure relates to a touch sensor integrated type display device capable of perceiving touch of the display device, and a method of manufacturing the same.

DISCUSSION OF THE RELATED ART

In recent years, various input devices such as a keyboard, a mouse, a joystick and a digitizer have been used to interface between a user and home appliances or telecommunication devices. However, when a user makes use of the input devices, the user's dissatisfaction may increase because the user is required to know how to use the input devices and because the input devices occupy space. In contrast, a touch sensor can input information by directly contacting a screen with a user's finger or a pen.

The touch sensor has a simple configuration capable of minimizing erroneous operations. Also, the user can perform an input action without using a separate input device, and can quickly and easily manipulate a device through contents displayed on a screen. Accordingly, the touch sensor has been applied to various display devices.

The touch sensor used in the display devices may be classified into an add-on type touch sensor and an on-cell type touch sensor. The add-on type touch sensor is configured such that the display device and the add-on type touch sensor are individually and/or separately manufactured, and then the add-on type touch sensor is attached to an upper substrate or portion of the display device. The on-cell type touch sensor is configured such that components constituting the on-cell type touch sensor are directly formed on the surface of an upper portion of the display device, such as an upper glass substrate.

Add-on type touch sensors cause the thickness of a display device to increase because the add-on type touch sensor has a structure in which the add-on type touch sensor is mounted on the display device. Further, the visibility of the display device is reduced because of a reduction in a brightness of the display device resulting from the increased thickness.

On the other hand, the on-cell type touch sensor shares the glass substrate with the display device because the on-cell type touch sensor has the structure in which the on-cell type touch sensor is formed on the surface of the glass substrate of the display device. Therefore, a thickness of the display device using the on-cell type touch sensor is less than a thickness of the display device using the add-on type touch sensor. However, the entire thickness of the display device implementing the on-cell type touch sensor increases because of a touch driving electrode layer, a touch sensing electrode layer, and an insulating layer for insulating the touch driving electrode layer and the touch sensing electrode layer which constitute the on-cell type touch sensor. Further, the number of processes and the manufacturing cost in the on-cell type touch sensor are numerous.

SUMMARY OF THE INVENTION

Embodiments of the invention provide a touch sensor integrated type display device with a reduced thickness and simpler manufacturing process, which may be accomplished by sharing a touch sensing element for recognizing a touch operation with a component of the display device, and a method of manufacturing the same.

Embodiments of the invention also provide a touch sensor integrated type display device capable of enhancing touch sensibility by increasing mutual capacitance between touch driving electrodes and touch sensing electrodes through an increased number of the touch driving and sensing electrodes, and a method of manufacturing the same.

In one aspect, there is a touch sensor integrated type display device comprising a plurality of first electrodes arranged on a first layer in parallel to each other; a plurality of first sub-pixel electrodes formed at least one side of the first electrode on the first layer, and spaced from the first electrode; a plurality of second electrodes arranged on a second layer in parallel to each other, the second layer being disposed at an upper side or a lower side of the first layer; and a plurality of second sub-pixel electrodes formed at least one side of the second electrode on the second layer, and spaced from the second electrode, wherein the plurality of first electrodes constitute a plurality of first electrode lines arranged in a first direction, and each of the plurality of first electrodes is formed to be overlapped with at least one of the plurality of second sub-pixel electrodes, and wherein the plurality of second electrodes constitute a plurality of first electrode lines arranged in a second direction crossing over the first direction, and each of the plurality of second electrodes is formed to be overlapped with at least one of the plurality of first sub-pixel electrodes.

In another aspect, there is a touch sensor integrated type display device comprising a plurality of gate lines formed on a substrate in parallel to each other; a gate insulation layer covering the plurality of gate lines; a plurality of data lines formed on the insulation layer to cross over the gate lines; a transistor formed in each of a plurality of pixel areas defined by cross of the gate lines and the data lines; a first passivation layer covering the gate insulation on which the transistor is formed; a first sub-pixel electrode formed on the first passivation layer in a first pixel area of the plurality of pixel areas; a first electrode formed on the first passivation layer in a second pixel area of the plurality of pixel areas; a second passivation layer covering the first passivation layer on which the sub-pixel electrode and the first electrode are formed; a second electrode formed on the second passivation layer in the first pixel area; and a second sub-pixel electrode formed on the second passivation layer in the second pixel area, wherein the first sub-pixel electrode is connected with the transistor in the first sub-pixel area via a first contact hole passing through the first passivation layer, the second sub-pixel electrode is connected with the transistor in the second sub-pixel area via a second contact hole passing through the first and second passivation layers, and the first electrode is disposed to be opposite to the second sub-pixel electrode and the second electrode is disposed to be opposite to the first sub-pixel electrode In another aspect, there is a method of manufacturing a touch sensor integrated type display device comprising: forming a first conductive layer on a substrate, and forming a gate line and a gate electrode using first mask process; forming a gate insulation on the substrate on which the gate line and the gate electrode are formed, forming a semiconductor layer on the gate insulation, and forming a semiconductor pattern on a region of the gate insulation layer corresponding to the gate electrode by patterning the semiconductor layer using a second mask process; forming a data metal layer as a second conductive layer on the gate insulation layer, and forming first conductive pattern group including a data line, a source electrode extended from the data line and a drain electrode opposite to the source electrode by pattering the data metal layer using a third mask process; forming a first passivation layer on an entire surface of the gate insulation layer on which the first conductive pattern group is formed, and forming a first contact hole which exposes a portion of each the drain electrode in first and second sub-pixel areas by etching the first passivation layer using a fourth mask process; forming a first transparent conductive layer as a third conductive layer on the first passivation layer in which the first and second contact holes are formed, and forming a first sub-pixel electrode in the first pixel area and a first electrode in the second pixel area by patterning the first transparent conductive layer using a fifth mask process; forming a second passivation layer on the first passivation layer on which the first sub-pixel electrode and the first electrode are formed, and forming a third contact hole in the second passivation to expose a portion of the drain electrode in the second pixel area by etching the second passivation layer using a sixth mask process; and forming a second transparent conductive layer as a fourth conductive layer on the second passivation layer in which the third contact hole is formed, and forming a second electrode in the first pixel area and a second sub-pixel electrode in the second pixel area by etching the second transparent conductive layer using a seventh mask process, wherein the first electrode is disposed to be opposite to the second sub-pixel electrode and the second electrode is disposed to be opposite to the first sub-pixel electrode.

In the construction, a common voltage is supplied to the plurality of first electrodes and the plurality of second electrodes during a display operation, and a touch driving voltage is supplied to the plurality of second electrodes during a touch operation.

A common voltage may be supplied to the plurality of first electrodes and the plurality of second electrodes during a display operation, and a touch driving voltage may be supplied to the plurality of first electrodes during a touch operation.

One of the first electrode and the second sub-pixel electrode which are opposite to each other has a plurality of slits, and one of the second electrode and the first sub-pixel electrode which are opposite to each other has a plurality of slits.

The first sub-pixel electrode includes a R sub-pixel electrode and a G sub-pixel electrode, and the second sub-pixel electrode includes a B sub-pixel electrode, and the first electrode is formed to be opposite to the R and G sub-pixel electrodes and the second electrode is formed to be opposite to the B sub-pixel electrode.

The first sub-pixel electrode includes a R sub-pixel electrode, and the second sub-pixel electrode includes a G sub-pixel electrode and B sub-pixel electrode, and the first electrode is formed to be opposite to the R sub-pixel electrode, and the second electrode is formed to be opposite to the G and B sub-pixel electrodes.

The first sub-pixel electrode includes a B sub-pixel electrode and a R sub-pixel electrode, and the second sub-pixel electrode includes a G sub-pixel electrode, and the first electrodes are formed to be opposite to the B and R sub-pixel electrodes and the second electrode is formed to be opposite to the G sub-pixel electrode.

The first sub-pixel electrode includes a G sub-pixel electrode, and the second sub-pixel electrode includes a B sub-pixel electrode and R sub-pixel electrode, the first electrodes are formed to be opposite to the G sub-pixel electrode, and the electrode is formed to be opposite to the B and R sub-pixel electrodes.

The first and second conductive layers are selected from Cu, CuOx, Al, AlNd, Mo, MoTi, and Cr, and the first and second transparent conductive layers are selected from indium tin oxide (ITO), indium zinc oxide (IZO), and gallium-doped zinc oxide (GZO).

BRIEF DESCRIPTION OF THE DRAWINGS

The teachings of the embodiments can be readily understood by considering the following detailed description in conjunction with the accompanying drawings.

DETAILED DESCRIPTION OF THE EMBODIMENTS

Figure 1:
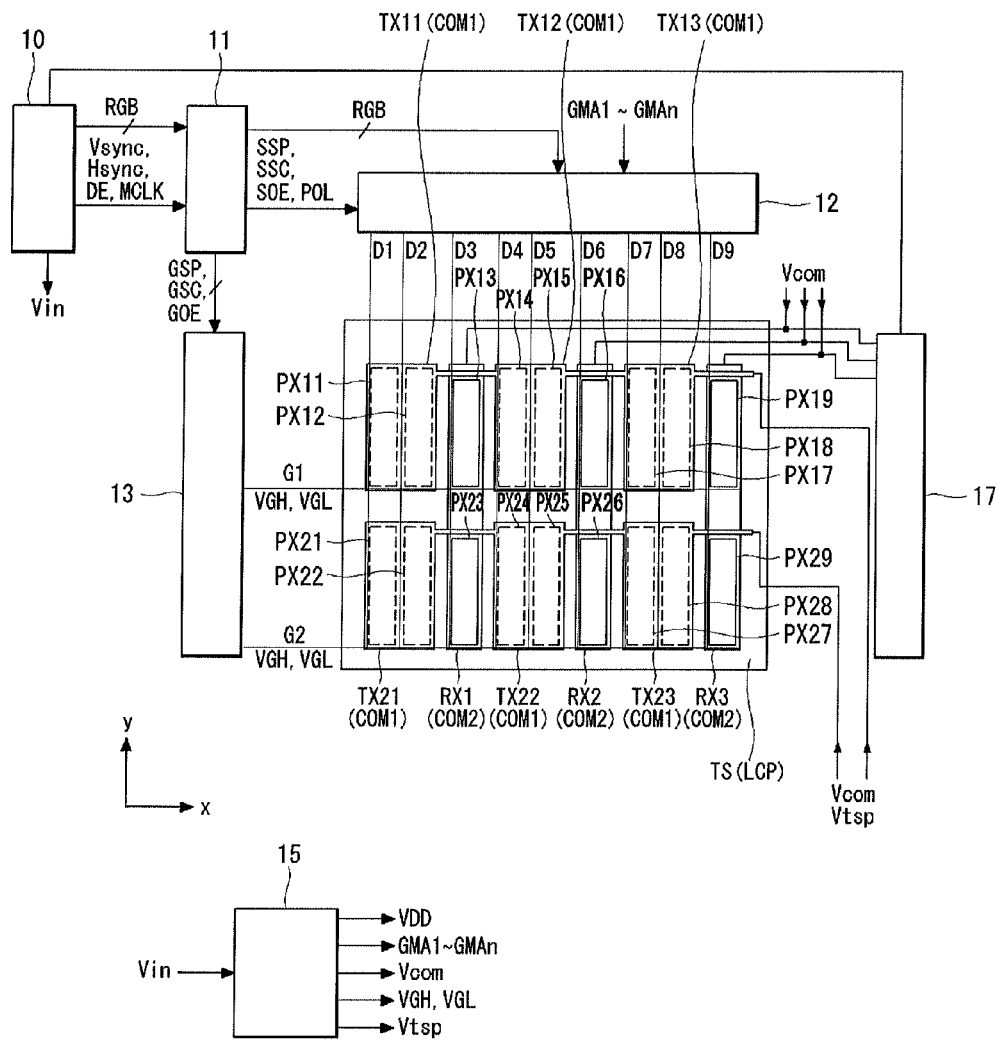
FIG. 1 is a block diagram schematically illustrating a touch sensor integrated type display device according to one embodiment of the invention.

Hereinafter, exemplary embodiments of this disclosure will be described in detail with reference to the accompanying drawings, wherein same reference numerals may be used to denote the same or substantially the same elements throughout the specification and the drawings.

A touch sensor integrated type display device according to an example embodiment of the invention is described in detail with reference to FIGS. 1 to 3. FIG. 1 is a block diagram schematically illustrating a touch sensor integrated type display device according to one embodiment of the invention, FIG. 2 is a partial exploded perspective view schematically showing the display device shown in FIG. 1, and FIG. 3 is a cross-sectional view illustrating one pixel area of the thin film transistor array shown in FIG. 2.

In the following description, a touch sensor integrated type liquid crystal display (LCD) device is used as an example of the touch sensor integrated type display device. However, any number or type of display devices are contemplated within the scope of the present disclosure.

Figure 2:
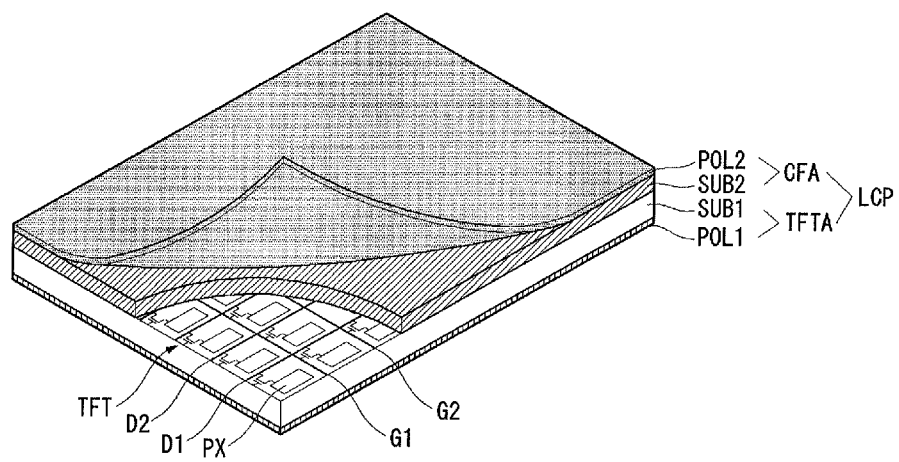
FIG. 2 is a partial exploded perspective view schematically showing the display device shown in FIG. 1.
Figure 3:
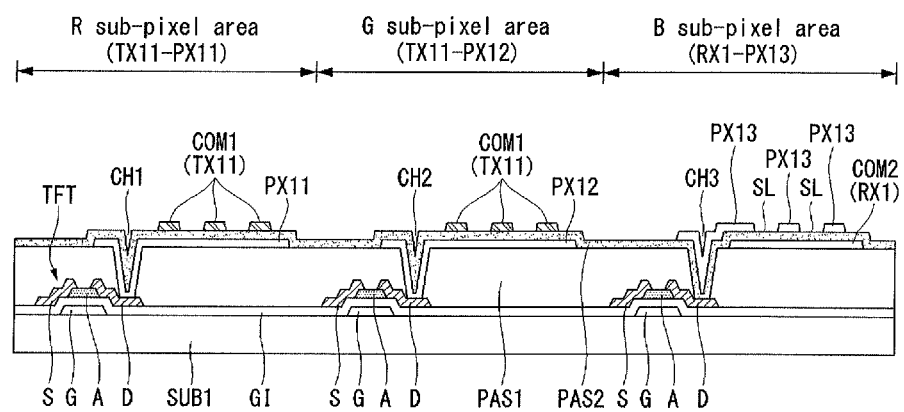
FIG. 3 is a cross-sectional view illustrating one pixel area of the thin film transistor array shown in FIG. 2.

Referring to FIGS. 1 and 2, the touch sensor integrated type LCD device according to one embodiment of the invention includes a liquid crystal display panel LCP, a host controller 10, a timing controller 11, a data driver 12, a gate driver 13, a power supply unit 15, and a touch recognition processor 17.

The liquid crystal display panel LCP includes a color filter array CFA and a thin film transistor (TFT) array TFTA with a liquid crystal layer (not shown) interposed therebetween.

In the example shown in FIG. 1, the TFT array TFTA includes a plurality of gate lines G1 and G2 which are formed parallel to one another on a first substrate SUBS1 in a first direction (for example, x-axis), a plurality of data lines D1 to D9 which are formed parallel to one another in a second direction (for example, a y-axis direction) to cross the plurality of gate lines G1 and G2, a plurality of TFTs respectively formed at crossings of the gate lines G1 and G2 and the data lines D1 to D9, a plurality of sub-pixel electrodes PX11, PX12, PX13, . . . PX19, PX21, PX22, PX23, . . . and PX29 for charging data voltages in liquid crystal cells, and first and second common electrodes COM1 and COM2 positioned to be opposite to the plurality of pixel electrodes PX11, PX12, PX13, PX19, PX21, PX22, PX23, . . . and PX29.

A pixel electrode may include three types of sub-pixel electrodes, for example a R (red color) sub-pixel electrode, G (green color) sub-pixel electrode and B (blue color) sub-pixel electrode. In the description of the following embodiments of the invention, two types of sub-pixel electrodes in the pixel electrode, e.g., the R and G sub-pixel electrodes of a pixel electrode, are described as being opposite to or corresponding with the first common electrode COM1. The remaining type of sub-pixel electrode in the pixel electrode, e.g., a B sub-pixel electrode, is described as being opposite to or corresponding with the second common electrode COM2. However, any number of variations are contemplated. One or more particular sub-pixel electrodes of a pixel electrode may be opposite to or corresponding with the first common electrode COM1, and one or more other sub-pixel electrodes of the pixel electrode may be opposite to or corresponding with the second common electrode COM2. It should also be understood that a pixel electrode may include more than three types of sub-pixel electrodes, and the relationship or correspondence of the sub-pixel electrodes to the first and second common electrodes may be changed or modified in any way.

In FIG. 2, the color filter array CFA includes black matrixes and color filters (not shown) which are formed on a second substrate SUBS2. Polarizing plates POL1 and POL2 are respectively attached to outer surfaces of the first substrate SUBS1 and the second substrate SUBS2 of the liquid crystal display panel LCP. Alignment layers (not shown) for setting a pre-tilt angle of liquid crystals are respectively formed on inner surfaces of the first substrate SUBS1 and the second substrate SUBS2 contacting the liquid crystals. A column spacer (not shown) may be formed between the first substrate SUBS1 and the second substrate SUBS2 to maintain cell gaps of the liquid crystal cells.

A backlight unit (not shown) is disposed under the TFT array TFTA. The backlight unit includes a plurality of light sources to uniformly irradiate light onto the TFT array TFTA and the color filter array CFA. The backlight unit may be implemented as one of an edge type backlight unit and a direct type backlight unit. The light sources of the backlight unit may include one or more of a hot cathode fluorescent lamp (HCFL), a cold cathode fluorescent lamp (CCFL), an external electrode fluorescent lamp (EEFL), and a light emitting diode (LED).

In some implementations, the first and second common electrodes COM1 and COM2 may be formed on the second substrate SUBS2 to drive a vertical electric field, such as according to a twisted nematic (TN) mode and/or a vertical alignment (VA) mode. In other implementations, the first and second common electrodes COM1 and COM2 may be formed on the first substrate SUBS1 along with the pixel electrodes P to drive a horizontal electric field, such as according to an in-plane switching (IPS) mode and/or a fringe field switching (FFS) mode. In FIGS. 1 and 2, the first and second common electrodes COM1 and COM2 drive a horizontal electric field with the pixel electrodes P.

FIG. 3 is a cross-sectional view illustrating one pixel area of the thin film transistor array shown in FIG. 2. FIG. 3 shows a relationship among first and second common electrodes COM1 and COM2, sub-pixel electrodes PX11, PX12 and PX13, a touch driving electrode TX11 and a touch sensing electrode RX1 in one pixel area that includes a R sub-pixel area, G sub-pixel area and B sub-pixel area.

Referring to FIGS. 1 and 3, the first common electrode COM1 according to one embodiment of the invention is opposite to or corresponds with the R and G sub-pixel electrodes PX11 and PX12 with a second passivation layer PAS2 therebetween. The second common electrode COM2 is opposite to or corresponds with the B sub-pixel electrode PX13 with a second passivation layer PAS2 therebetween. The first common electrode COM1 is formed on an upper surface of the second passivation layer PAS2 in the R and G sub-pixel areas. The second common electrode COM2 is formed on a lower surface of the second passivation layer PAS2 in the B sub-pixel area.

In the example of FIGS. 1 and 3, the first common electrode COM1 is used as (e.g., operates, at least in part, as) touch driving electrodes TX11, TX12, TX13, TX21, TX22 and TX23, and the second common electrode COM2 is used as (e.g., operates, at least in part, as) touch sensing electrodes RX1, RX2 and RX3. Alternatively, the first common electrode COM1 may operate as touch sensing electrodes RX1, RX2 and RX3, and the second common electrode COM2 may operate as touch driving electrodes TX11, TX12, TX13, TX21, TX22 and TX23.

The touch sensor integrated type display device according to one embodiment of the invention will be described in detail with reference to FIGS. 1 to 3. The touch sensor integrated type display device includes gate lines G1 and G2 and data lines D1 to D9, which cross over each other on a first substrate SUBS1. A plurality of TFTs are respectively disposed at crossings of the gate lines G1 and G2 and the data lines D1 to D9, and a plurality of sub-pixel electrodes PX11, PX12, PX13, . . . PX19, PX21, PX22, PX23, . . . and PX29 are disposed in areas defined by the crossings of the gate lines G1 and G2 and the data lines D1 to D9. The first and second common electrodes COM1 and COM2 are positioned to be opposite to the plurality of pixel electrodes PX11, PX12, PX13, . . . PX19, PX21, PX22, PX23, . . . and PX29. In the following exemplary description, the first common electrode COM1 is used as touch driving electrodes and the second common electrode COM2 is used as touch sensing electrodes. Accordingly, the first common electrode COM1 may also be referred to as the touch driving electrodes TX11, TX12, TX13, TX21, TX22 and TX23 and the second common electrode COM2 may also be referred to as the touch sensing electrodes RX1, RX2 and RX3.

In the following description, the touch driving electrodes may be particularly referred to as TX11, TX12, TX13, TX21, TX22 and TX23 to specify a particular position or a particular touch driving electrode, but are also referred to as TX to generally indicate touch driving electrodes. Similarly, the touch sensing electrodes may be particular referred to as RX1, RX2 and RX3 to specify a particular position or particular touch sensing electrode, but are also referred to as RX to generally indicate the touch sensing electrodes.

The thin film transistors TFTs may include a gate electrode G extended from the gate line G1, an active layer A formed on a gate insulation layer GI covering the gate line G1 and the gate electrode G so as to overlap with a portion of the gate electrode G, a source electrode S extended from the data line D1 which is formed on a first passivation layer PAS1 covering the active layer A, and a drain electrode opposite to the source electrode S.

The position of the sub-pixel electrodes and the common electrodes formed on the first passivation layer PAS1 may differ according to the R, G and B sub-pixels areas. Referring to FIG. 3, the R sub-pixel electrode PX11 is formed on the first passivation layer PAS1 within the R sub-pixel area, and the G sub-pixel electrode PX12 is formed on the first passivation layer PAS1 within the G sub-pixel area. However the second common electrode COM2 is formed on the first passivation layer PAS1 within the B sub-pixel area. The second common electrode COM2 serves as the touch sensing electrode RX1.

The first common electrode COM1 is formed on the second passivation layer PAS2 within the R sub-pixel area and overlapping with (e.g., above or opposite to) the R sub-pixel electrode PX11. The first common electrode COM1 is also formed on the second passivation layer PAS2 within the G sub-pixel area and overlapping with or opposite to the G sub-pixel electrode PX12. The second common electrode COM2 is formed on the first passivation layer PAS1 within the B sub-pixel area and overlapping with (e.g., below or opposite to) the B sub-pixel electrode PX13. The B sub-pixel electrode PX 13 is formed on the second passivation layer PAS2. The first common electrode COM1 serves as the touch driving electrode TX11, the second common electrode serves as the touch sensing electrode RX1, and the second passivation layer PAS2 covers the R and G sub-pixel electrodes PX11 and PX12 and the second common electrode COM2.

The R sub-pixel electrode PX11 is connected with the drain electrode D of the thin film transistor TFT via a first contact hole CH1 passing through the first passivation layer PAS1 in the R sub-pixel area. The G sub-pixel electrode PX12 is connected with the drain electrode D of the thin film transistor TFT via a second contact hole CH2 passing through the first passivation layer PAS1 in the G sub-pixel area. And the B sub-pixel electrode PX13 is connected with the drain electrode D of the thin film transistor TFT via a third contact hole CH3 passing through the first and second passivation layers PAS1 and PAS2 in the B sub-pixel area.

Figure 5:
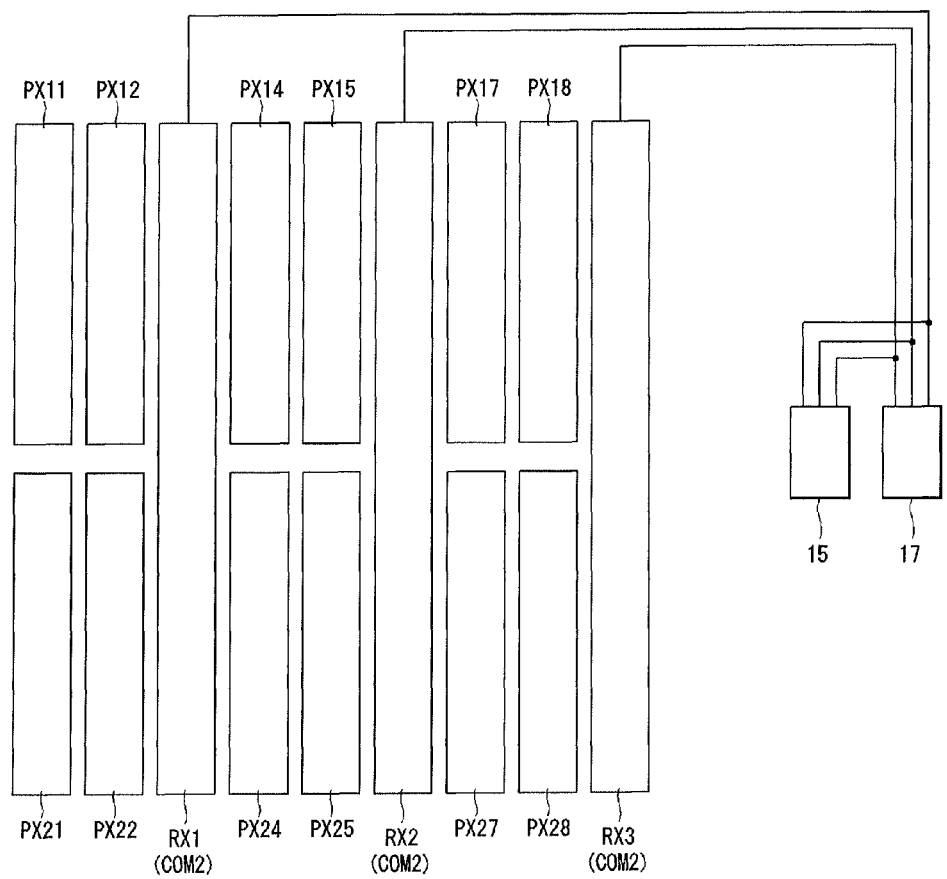
FIG. 5 is a top plan view illustrating R and G sub-pixel electrodes and touch sensing electrodes (a second common electrode) made of a first transparent electrode formed on a first passivation layer of the touch sensor integrated type display device according to an embodiment of the invention.
Figure 6:
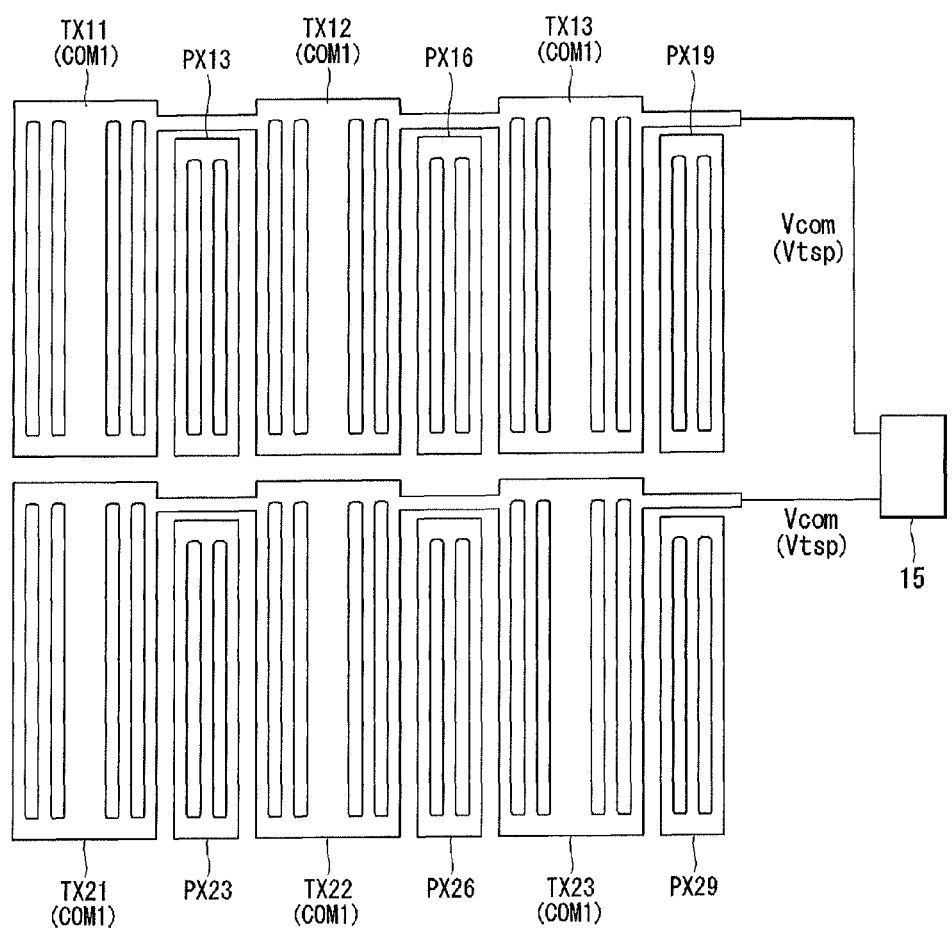
FIG. 6 is a top plan view illustrating B sub-pixel electrodes and touch driving electrodes (a first common electrode) made of a second transparent electrode formed on a second passivation layer of the touch sensor integrated type display device according to an embodiment of the invention.

The R sub-pixel electrode PX11, the G sub-pixel electrode PX12 and the second electrode COM2 formed on the first passivation layer PAS1 may no slits, for example as shown in FIG. 5 where electrodes do not have slits or openings. That is, the R sub-pixel electrode PX11, the G sub-pixel electrode PX12 and the second electrode COM2 may be formed without any openings. The first common electrode COM1 and the B sub-pixel electrode PX13 formed on the second passivation layer PAS2 may have a plurality of slits, for example as shown in FIG. 6 where electrodes have slits. However, the invention is not limited thereto. For example, in some implementations, the first common electrode COM1 may have no slits when the R or G sub-pixel electrode PX11 or PX12 (which are opposite to the first common electrode COM1) has slits, or vice versa. Similarly, the second common electrode COM2 may has slits when the B sub-pixel electrodes PX 13 (which is opposite to the common electrode COM 2) has no slits, or vice versa.

As shown from FIG. 3, the first and second common electrodes COM1 and COM2 are formed on different layers. Similarly, the R and G sub-pixel electrodes PX11 and PX12 are also formed on a layer different from the layer on which the B sub-pixel electrode PX13 is formed.

The relationship between the touch driving electrodes and the touch sensing electrodes of the touch sensor integrated type display device according to an embodiment of the invention will be described in detail with reference to FIGS. 4 to 6.

Figure 4:
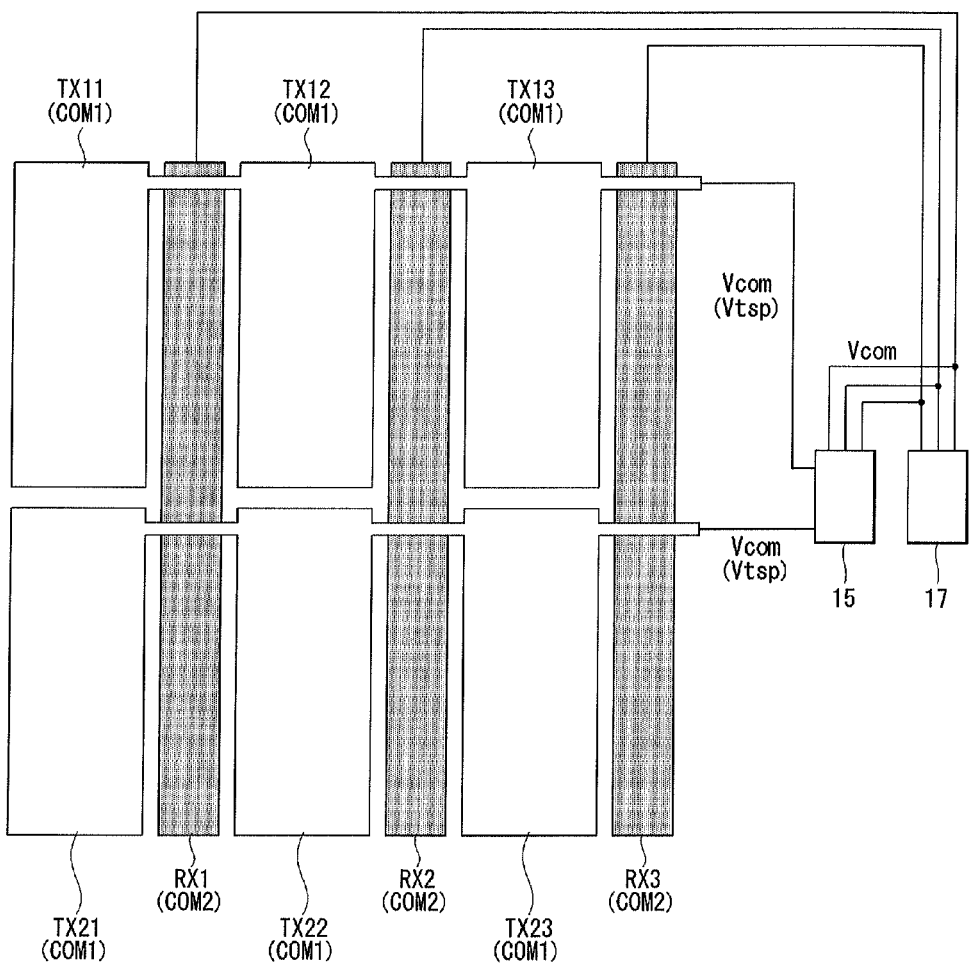
FIG. 4 is a top plan view illustrating a relationship of touch driving electrodes and touch sensing electrodes of the touch sensor integrated type display device according to an embodiment of the invention.

FIG. 4 is a top plan view illustrating a relationship of touch driving electrodes TX and touch sensing electrodes RX of the touch sensor integrated type display device according to an embodiment of the invention. In FIG. 4, the sub-pixel electrodes are omitted to obviate complication of the drawing. FIG. 5 is a top plan view illustrating R and G sub-pixel electrodes and touch sensing electrodes (a second common electrode) made of a first transparent electrode formed on a first passivation layer of the touch sensor integrated type display device according to an embodiment of the invention. Also, FIG. 6 is a top plan view illustrating B sub-pixel electrodes and touch driving electrodes (a first common electrode) made of a second transparent electrode formed on a second passivation layer of the touch sensor integrated type display device according to an embodiment of the invention.

In the following description in relation to FIGS. 4 and 5, wires connected to the R, G and B sub-pixel electrodes are omitted to obviate complication of the drawings. Although the wires connected to the R and G sub-pixel electrodes are not illustrated in FIGS. 4 and 5, it should be understood that the R sub-pixel electrodes PX11 and PX21, PX14 and PX24, PX17 and PX27 are respectively connected to the data lines D1, D4 and D7 via the drain electrodes D of the thin film transistors TFTs, G sub-pixel electrodes PX12 and PX22, PX15 and PX25, PX18 and PX28 are respectively connected to the data lines D2, D5 and D8 via the drain electrodes D of the thin film transistors TFTs, and the B sub-pixel electrodes PX13 and PX23, PX16 and PX26, PX19 and PX29 are respectively connected to the data lines D3, D6 and D9 via the drain electrodes D of the thin film transistors TFTs, as known from FIGS. 1 and 3. Accordingly, data voltages may be applied to the R, G, and B sub-pixel electrodes via the data lines D1 to D9.

Referring to FIG. 4, the touch driving electrodes TX11 and TX21, TX12 and TX22, and TX13 and TX23, and the touch sensing electrodes RX1, RX2, and RX3 are arranged in parallel along the first direction (for example, along an x-axis or in a horizontal direction) in an alternating fashion.

A first row of touch driving electrodes TX11, TX12 and TX13 are connected in serial along the first direction by connection portions. A second row of touch driving electrodes TX21, TX22 and TX23 are similarly connected in serial along the first direction by connection portions. The first row of touch driving electrodes TX11, TX12 and TX13 may be separate from the second row of driving electrodes TX21, TX22 and TX23 so that the first row of touch driving electrodes TX11, TX12 and TX13 are not in contact (e.g., electrical contact) with the second row of driving electrodes TX21, TX22 and TX23. A touch driving voltage Vtsp is supplied to the first and second row of touch driving electrodes TX11, TX12, TX13, TX21, TX22 and TX23 through a power supply unit 15 in a touch driving operation. A common voltage Vcom is supplied to the first and second row of touch driving electrodes TX11, TX12, TX13, TX21, TX22 and TX23 through a power supply unit 15 in a display driving operation. Accordingly, the first and second row touch driving electrodes TX11, TX12, TX13, TX21, TX22 and TX23 serve as touch driving electrodes when the touch driving voltage Vtsp is supplied or applied thereto, and serve as the common electrode when the common voltage Vcom is supplied or applied thereto. The power supply unit 15 or any other logic, portion, or circuitry of the display device may thus supply the Vtsp or Vcom depending on whether the common electrode COM1 operates as touch driving electrodes or as common electrodes.

A first, second, and third column of touch sensing electrodes RX1, RX2 and RX3 are arranged in parallel along a second direction (for example, along a y-axis or in a vertical direction). The first, second, and third columns of touch sensing electrodes RX1, RX2 and RX3 overlap with the connection portions connecting the first and second row of touch driving electrodes TX11, TX12 and TX13, or TX21, TX22 and TX2, but may not overlap with the touch driving electrodes TX11, TX12 and TX13, or TX21, TX22 and TX23.

The first, second, and third columns of touch sensing electrodes RX1, RX2 and RX3 are connected to the touch recognition processor 17 to detect touch positions by measuring variation of the mutual capacitance generated between the first and second row of touch driving electrodes and the first, second, and third columns of touch sensing electrodes before and after touch activities.

In the touch sensor integrated type display device, the first row of touch driving electrodes TX11, TX12 and TX13 constitutes or forms a first touch driving electrode line and the second row of touch driving electrodes TX21, TX22 and TX23 constitutes or forms a second touch driving electrode line. The first, second, and third columns of touch sensing electrodes RX1, RX2 and RX3 each constitute or form a touch sensing electrode line. In one embodiment, each of the touch driving electrodes is opposite to two type sub-pixel electrodes (e.g., R and G) and each of the touch sensing electrodes is opposite to one type sub-pixels electrodes (e.g., B). Accordingly, it is possible to obtain a touch unit pixel (e.g., a basic unit capable of recognizing a touch activity) with one pixel electrode that includes three sub-pixel electrodes.

Referring to FIG. 5, the G sub-pixel electrodes PX12 and PX22 and the R sub-pixel electrodes PX14 and PX24 are respectively arranged at a side of a first touch sensing electrode column RX1. The G sub-pixel electrodes PX12 and PX22 are arranged adjacent to the R sub-pixel electrodes PX11 and PX21. The G sub-pixel electrodes PX15 and PX25 and the R sub-pixel electrodes PX 17 and PX27 are respectively arranged at a side of a second touch sensing electrode column RX2, and the G sub-pixel electrodes PX18 and PX28 are arranged at one side of a third touch sensing electrode column RX3.

Referring to FIG. 6, the B sub-pixel electrode PX13 is disposed between the touch driving electrodes TX11 and TX12 in a first row of touch driving electrodes, the B sub-pixel electrode PX16 is disposed between the touch driving electrodes TX12 and TX13, and the B sub-pixel electrode PX19 is disposed at one side of the touch driving electrode TX13 of the first row. Referring to the second row of touch driving electrodes, the B sub-pixel electrode PX23 is disposed between the touch driving electrodes TX21 and TX22, the B sub-pixel electrode PX26 is disposed between the touch driving electrodes TX22 and TX23, and the B sub-pixel electrode PX29 is disposed at one side of the touch driving electrode TX23.

Referring again to FIG. 1, the gate driver 13 sequentially outputs a gate pulse (or a scan pulse) under the control of the timing controller 11 when in a display mode. The gate driver 13 shifts a swing voltage of the gate pulse to a gate high voltage VGH and a gate low voltage VGL. The gate pulse output from the gate driver 13 is synchronized with the data voltage output from the data driver 12 and is sequentially supplied to the gate lines G1 and G2. The gate high voltage VGH is equal to or greater than a threshold voltage of the TFT, and the gate low voltage VGL is less than the threshold voltage of the TFT. A plurality of gate driving integrated circuits (ICs) of the gate driver 13 may be connected to the gate lines G1 and G2 formed on the first substrate SUBS1 of the TFT array TFTA, for example through a tape automated bonding (TAB) process. Alternatively, the gate driving ICs of the gate driver 13 may be directly formed on the first substrate SUBS 1 of the TFT array TFTA along with pixels through a gate-in-panel (GIP) process.

The data driver 12 samples and latches digital video data RGB under the control of the timing controller 11. The data driver 12 converts the digital video data RGB into positive and negative gamma compensation voltages GMA1 to GMAn and may invert a polarity of the data voltage. The positive and negative data voltages output from the data driver 12 are synchronized with the gate pulses output from the gate driver 13. A plurality of source driving ICs of the data driver 12 may be connected to the data lines D1 to Dn formed on the first substrate SUBS1 of the TFT array TFTA through a chip-on glass (COG) process or the TAB process. The source driving ICs may be integrated inside the timing controller 11 and thus may be implemented as a single chip IC along with the timing controller 11.

The timing controller 11 generates timing control signals for controlling operation timings of the gate driver 13 and the data driver 12 using timing signals Vsync, Hsync, DE, and MCLK, which are received from the external host controller 10 and are used to drive the touch sensor integrated type liquid crystal display. The timing control signals include a gate timing control signal for controlling the operation timing of the gate driver 13 and a data timing control signal for controlling the operation timing of the data driver 12 and the polarity of the data voltage.

The gate timing control signal includes a gate start pulse GSP, a gate shift clock GSC, a gate output enable GOE, and the like. The gate start pulse GSP is applied to a first gate driving IC of the gate driver 13 to output a first gate pulse in each frame period and controls a shift start timing of the first gate driving IC. The gate shift clock GSC is commonly input to the gate driving ICs of the gate driver 13 and also shifts the gate start pulse GSP. The gate output enable GOE controls output timings of the gate driving ICs of the gate driver 13.

The data timing control signal includes a source start pulse SSP, a source sampling clock SSC, a polarity control signal POL, a source output enable SOE, and the like. The source start pulse SSP is applied to a first source driving IC of the data driver 12 to firstly sample the data and controls a data sampling start timing. The source sampling clock SSC controls a sampling timing of data inside the source driving ICs based on a rising or falling edge thereof. The polarity control signal POL controls the polarity of the data voltage output from the source driving ICs. The source output enable SOE controls output timings of the source driving ICs. If the digital video data RGB is input to the data driver 102 through a mini low voltage differential signaling (LVDS) interface, the source start pulse SSP and the source sampling clock SSC may be omitted.

The power supply unit 15 may be implemented as a DC-DC converter including a pulse width modulation (PWM) circuit, a boost converter, a regulator, a charge pump, a voltage divider, an operational amplifier, etc. The power supply unit 15 regulates a voltage input from the host controller 10 and generates voltages to drive the liquid crystal display panel LCP, the data driver 12, the gate driver 13, the timing controller 11, and the backlight unit (not shown).

The voltages generated by the power supply unit 15 include a high potential power voltage VDD, the gate high voltage VGH, the gate low voltage VGL, a common voltage Vcom, positive and negative gamma reference voltages GMA1 to GMAn, a touch driving voltage Vtsp, and the like. The power supply unit 15 (or other logic, circuitry, or portion of the display device) supplies the common voltage Vcom to the first and second common electrodes COM1 and COM2 under the control of the host controller 10 during a display driving operation. Alternatively, the power supply unit 15 (or other logic, circuitry, or portion of the display device) supplies the common voltage Vcom to the first and second common electrodes COM1 and COM2 under the control of the timing controller 11 during a display driving operation. The power supply unit 15 (or other logic, circuitry, or portion of the display device) supplies the touch driving voltage Vtsp to the touch driving electrodes TX11, TX12, TX13, TX21, TX22 and TX23 under the control of the host controller 10 during a touch driving operation. Alternatively, power supply unit 15 (or other logic, circuitry, or portion of the display device) may supply the touch driving voltage Vtsp to the touch driving electrodes TX11, TX12, TX13, TX21, TX22 and TX23 under the control of the timing controller 11 during a touch driving operation.

In the embodiment shown in FIG. 1, the touch driving voltage Vtsp is supplied to the touch driving electrodes TX11, TX12, TX13, TX21, TX22 and TX23 through the power supply unit 15, but the invention is not limited thereto. For example, the touch recognition processor 17 may supply the touch driving voltage Vtsp to the touch driving electrodes TX11, TX12, TX13, TX21, TX22 and TX23, e.g., under the control of the host controller 10 or the timing controller 11.

The host controller 10 transfers the digital video data RGB of an input image and the timing signals Vsync, Hsync, DE, and MCLK required to drive the touch sensor integrated type liquid crystal display to the timing controller 11 through an interface, such as the LVDS interface and a transition minimized differential signaling (TMDS) interface. When the touch sensor integrated type liquid crystal display is driven so as to display the image on its screen (e.g. operating in a display mode), the host controller 100 supplies a control signal Vin for controlling the power supply unit 15, so that the common voltage Vcom can be supplied to the first and second common electrode COM1 and COM2. When the touch sensor integrated type liquid crystal display is driven for the touch recognition (e.g., operating in a touch recognition mode), the host controller 10 supplies a control signal Vin for controlling the power supply unit 15, so that the touch driving voltage Vtsp can be supplied to the touch driving electrodes TX11, TX12, TX13, TX21, TX22 and TX23.

The touch recognition processor 17 differentially amplifies a difference voltage between a voltage of an initial capacitance measured through each of the touch sensing electrodes RX1, RX2 and RX3 before touch activities and a voltage of a touch capacitance measured through each of the touch sensing electrodes RX1, RX2 and RX3 after the touch activities. The touch recognition processor 17 then converts the result of a differential amplification into digital data. The touch recognition processor 17 may determine a touch position based on a difference between the initial capacitance and the touch capacitance using a touch recognition algorithm and may output touch coordinate data indicating the touch position to the host controller 10.

As described above, the touch sensor integrated type display device according to one embodiment of the invention has a construction in which rows of touch driving electrodes, such as TX11, TX12, and TX13 as well as TX21, TX22 and TX23, cross over columns of touch sensing electrodes, such as RX1, RX2 and RX3. That is, touch driving electrodes are connected to each other in a first direction (for example, x-axis direction) to form touch driving electrode lines (e.g., rows), and touch sensing electrodes are arranged in a second direction (for example, y-axis direction) to form touch sensing electrode lines (e.g., columns). Accordingly, if a touch is performed on the touch sensor integrated type display device, it is possible to detect the position where the touch is performed by detecting the difference of mutual capacitance generated between the touch driving electrode lines and the touch sensing electrode lines.

Thus, the display device described herein may implement a touch unit pixel (e.g., a basic unit capable of recognizing a touch activity) through one pixel electrode including three types of sub-pixel electrodes (for example, R, G and B sub-pixel electrodes). In the embodiments described above, each touch driving electrode corresponds to two different types of sub-pixel electrodes (for example, R and G sub-pixel electrodes) and each touch sensing electrode corresponds to one type of sub-pixel electrodes (for example, B sub-pixel electrodes). Accordingly, it is possible to increase mutual capacitance between the touch driving electrodes and the touch sensing electrodes as the number of touch driving and touch sensing electrodes in the display device increases and thereby improve a touch sensibility of the touch sensor integrated type display device.

Hereinafter, a method of manufacturing the touch sensor integrated type display device according to an exemplary embodiment of the invention will be described with reference to FIGS. 7A to 13B. The following description refers to a first sub-pixel area (TX11-PX11 area or TX11-PX12 area) that includes a touch driving electrode TX11 and the R or G sub-pixel electrode PX11 or PX12 and also refers to a second sub-pixel area (RX1-PX13 area) that includes a touch sensing electrode RX1 and the B sub-pixel electrode PX13. In FIGS. 7A to 13B, upper drawings illustrate the first sub-pixels area (TX11-PX11 area or TX11-PX12 area), and lower drawings illustrate the second sub-pixel area (RX1-PX13 area). Also, although one sub-pixel region is defined by a pair of gate line adjacent to each other and a pair of data lines adjacent to each other, only one gate line and one data line (instead of the respective pairs) are shown in the drawings for convenience.

Figure 7A:
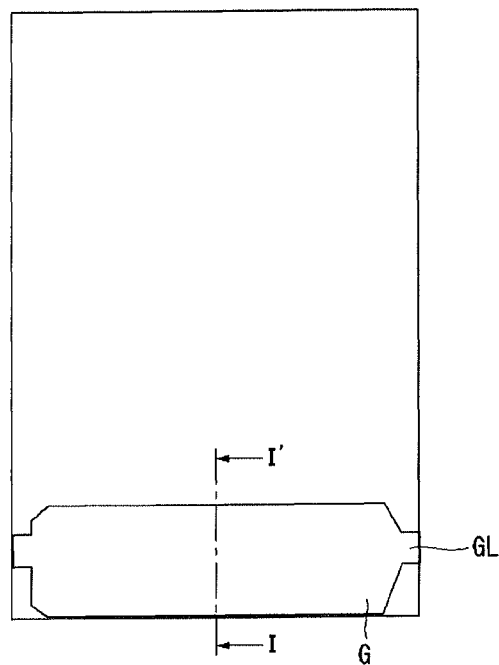
FIG. 7A is a top plan view illustrating a first mask process for manufacturing the touch sensor integrated type display device according to an embodiment of the invention.
Figure 7A:
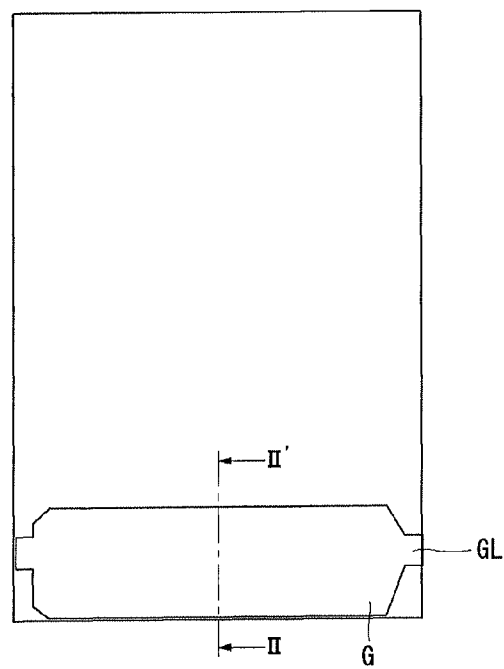
Figure 7B:
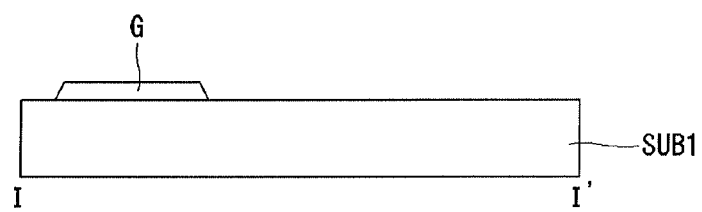
FIG. 7B is a cross-sectional view taken along lines I-I' and II-II' shown in FIG. 7A.
Figure 7B:
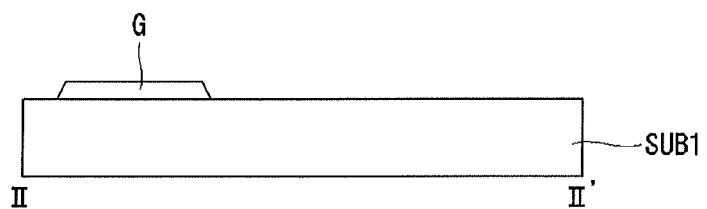

FIG. 7A is a top plan view illustrating a first mask process for manufacturing the touch sensor integrated type display device according to one embodiment of the invention, and FIG. 7B is a cross-sectional view taken along lines I-I' and II-II' shown in FIG. 7A.

Referring to FIGS. 7A and 7B, a gate metal layer is deposited on a first substrate SUB1 as a first conductive layer through a deposition process, such as a sputtering process. Then, a gate line GL and a gate electrode G extended from the gate line GL are formed on the substrate SUB1 using a first mask process.

More specifically, a gate metal layer may be formed on the surface of the substrate SUB1 as a first conductive layer by a deposition process such as a sputtering process. For example, after a photo resist is entirely applied to the substrate SUB1 on which the first conductive layer is deposited, a first photo resist pattern (not shown) exposing a portion of the first conductive layer is formed through a photolithography process using a first mask. The first conductive layer exposed via the first photo resist pattern is removed by a wet etching. And then the first photo resist pattern is removed by an ashing process, thereby forming the gate line GL and the gate electrode G on the substrate SUB1. The first conductive layer may be selected from metal material such as Al, AlNd, Mo, MoTi, Cu, and Cr.

Figure 8A:
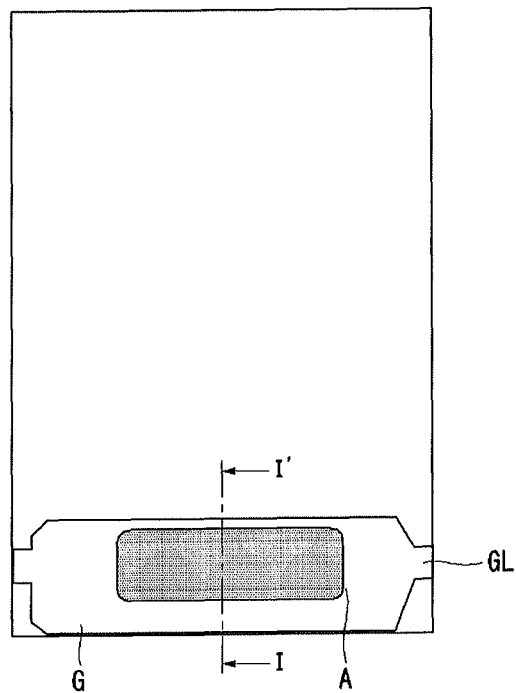
FIG. 8A is a top plan view illustrating a second mask process for manufacturing the touch sensor integrated type display device according to an embodiment of the invention.
Figure 8A:
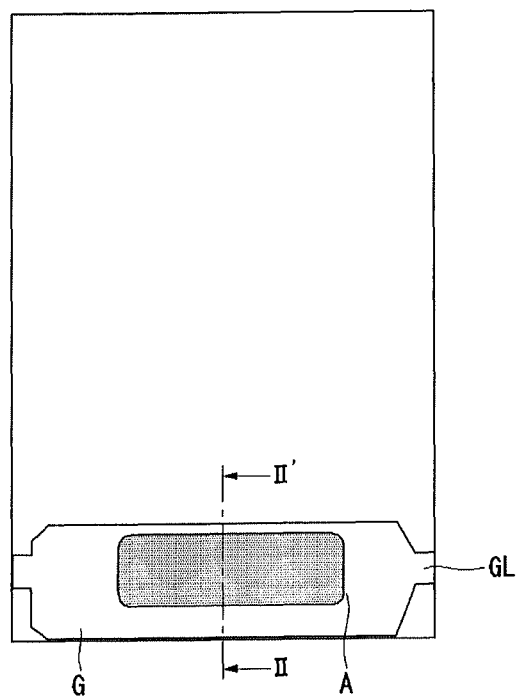
Figure 8B:
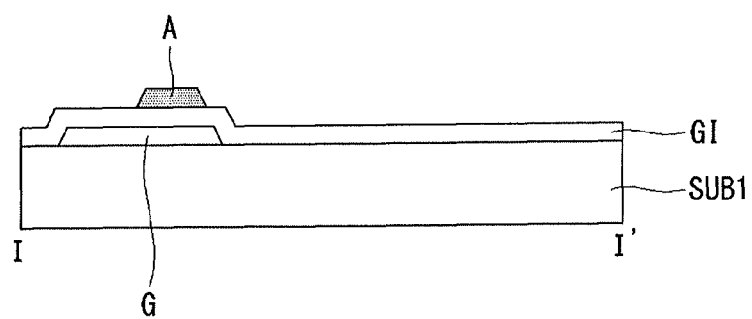
FIG. 8B is a cross-sectional view taken along lines I-I' and II-II' shown in FIG. 8A.
Figure 8B:
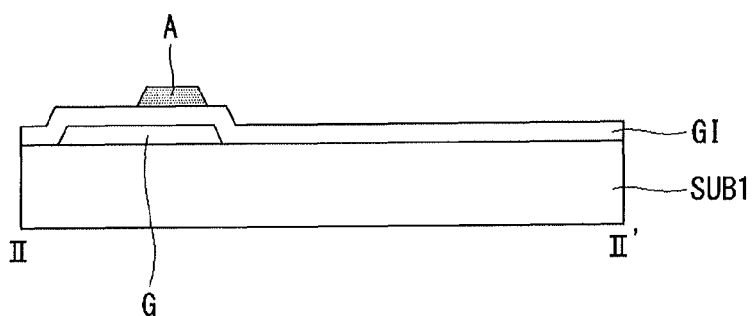

FIG. 8A is a top plan view illustrating a second mask process for manufacturing the touch sensor integrated type display device according to one embodiment of the invention, and FIG. 8B is a cross-sectional view taken along lines I-I' and II-II' shown in FIG. 8A.

Referring to FIGS. 8A and 8B, a gate insulation layer GI is formed on a surface of the substrate SUB1 on which the gate line GL and the gate electrode G are formed. Then, a semiconductor layer is formed on the gate insulation layer GI. A photo resist is formed on the semiconductor layer, and a second photo resist pattern (not shown) is formed to expose regions of the semiconductor layer excluding a channel region through a photolithography process using a second mask. The semiconductor layer exposed via the second photo resist pattern is removed by an etching process. And then the second photo resist pattern is removed by an ashing process, thereby forming the semiconductor pattern A as an active layer.

Figure 9A:
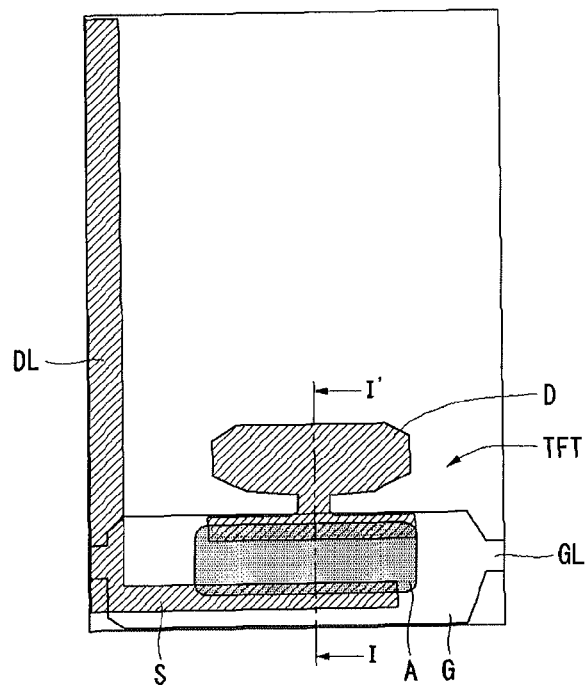
FIG. 9A is a top plan view illustrating a third mask process for manufacturing the touch sensor integrated type display device according to an embodiment of the invention.
Figure 9A:
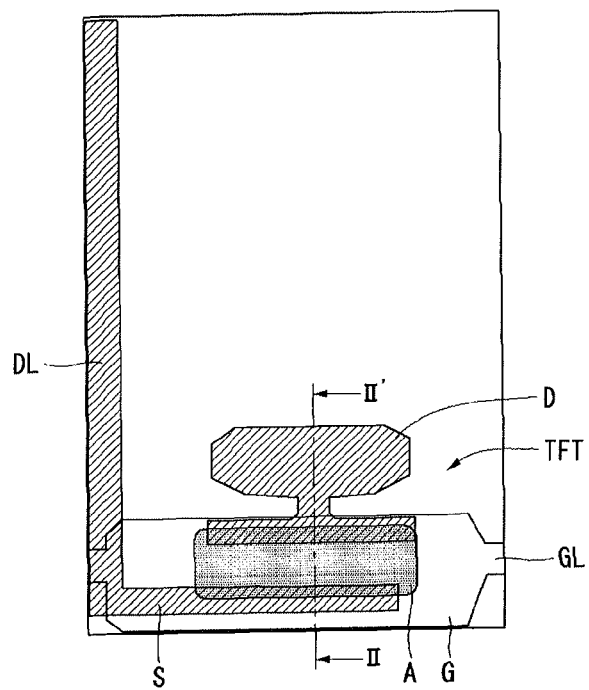
Figure 9B:
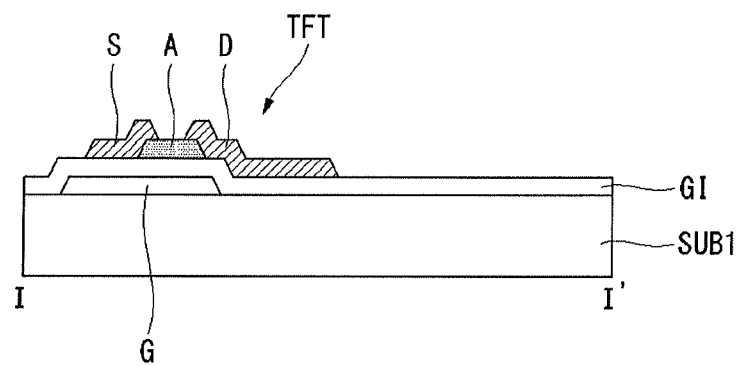
FIG. 9B is a cross-sectional view taken along lines I-I' and shown in FIG. 9A.
Figure 9B:
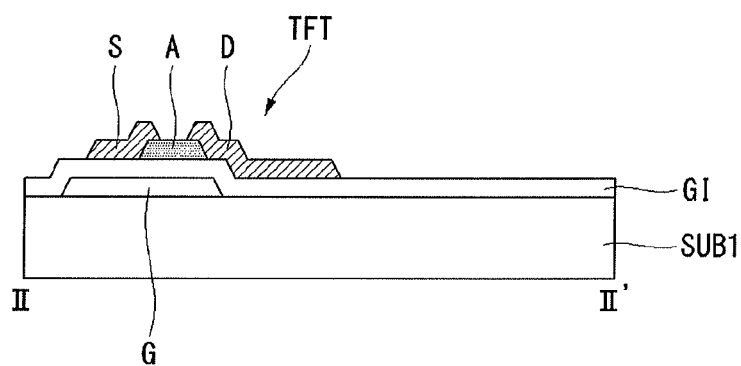

FIG. 9A is a top plan view illustrating a third mask process for manufacturing the touch sensor integrated type display device according to one embodiment of the invention, and FIG. 9B is a cross-sectional view taken along lines I-I' and II-II' shown in FIG. 9A.

Referring to FIGS. 9A and 9B, a data metal layer is formed as a second conductive layer on the gate insulation layer GI on which the semiconductor pattern A is formed. Then, a first conductive pattern group including a data line DL, a source electrode S, and a drain electrode D are formed on the gate insulation layer GI using a third mask process.

More specifically, a data metal layer is formed as a second conductive layer on the gate insulation layer GI on which the semiconductor pattern A is formed, a photo resist is deposited on the second conductive layer, and a third photo resist pattern (not shown) is formed through a photolithography process using a third mask. The third photo resist pattern exposes regions of the second conductive layer excluding regions on which a data line, a source electrode and a drain electrode are to be formed. The data line DL, the source electrode S, and the drain electrode D are formed by etching the second conductive layer exposed via the third photo resist pattern and removing the third photo resist pattern remaining on the second conductive layer. The data line DL crosses over the gate line GL with a gate insulation layer GI therebetween. The source electrode S is extended from the data line 120 and the drain electrode D is opposite to the source electrode S.

Figure 10A:
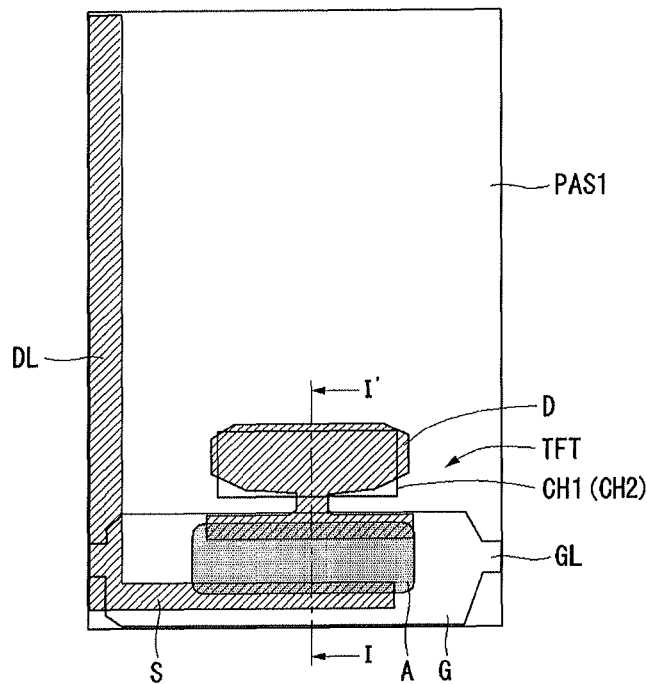
FIG. 10A is a top plan view illustrating a fourth mask process for manufacturing the touch sensor integrated type display device according to an embodiment of the invention.
Figure 10A:
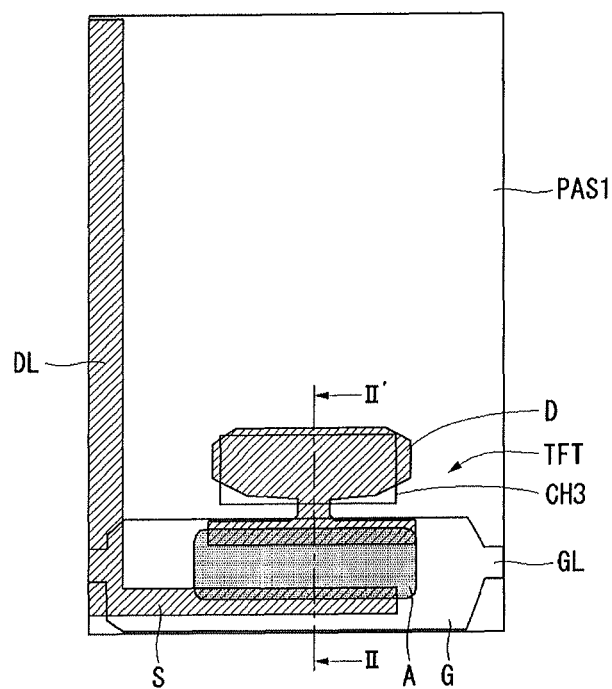
Figure 10B:
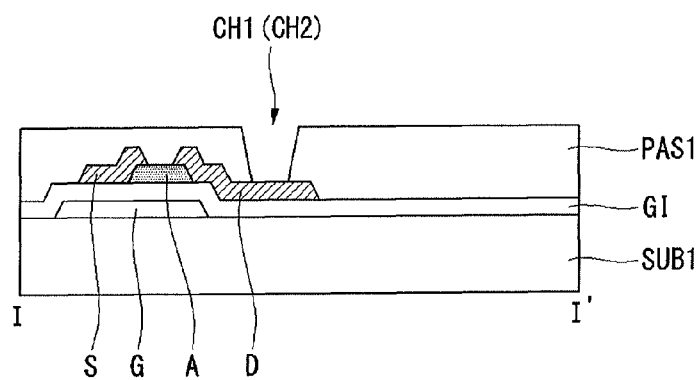
FIG. 10B is a cross-sectional view taken along lines I-I' and II-II' shown in FIG. 10A.
Figure 10B:
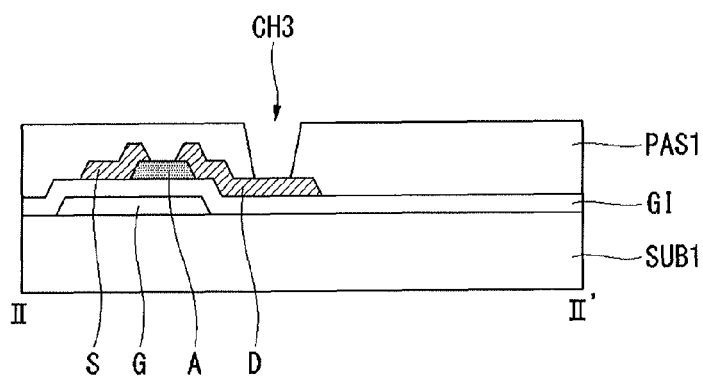

FIG. 10A is a top plan view illustrating a fourth mask process for manufacturing the touch sensor integrated type display device according to one embodiment of the invention, and FIG. 10B is a cross-sectional view taken along lines I-I' and II-II' shown in FIG. 10A.

Referring to FIGS. 10A and 10B, a first passivation layer PAS1 is formed on the gate insulation layer GI on which the data line DL, the source electrode S, and the drain electrode D are formed. Then, first, second, and third contact holes CH1, CH2 and CH3 are formed in the first passivation layer PAS1 to expose portions of the drain electrodes in the R, G, and B sub-pixel areas. The contact holes CH1, CH2, and CH3 may be formed by etching the first passivation layer PAS1 using a fourth mask process.

More specifically, a first passivation layer PAS1 is formed on the gate insulation layer GI on which the data line DL, the source electrode S and the drain electrode D are formed. A photo resist is formed on the first passivation layer PAS1, and a fourth photo resist pattern (not shown) is formed to expose a portion of the each drain electrode D in R sub-pixel area, G sub-pixel area and B sub-pixel area through a photolithography process using a fourth mask. Then the first, second, and third contact holes CH1, CH2, and CH3 respectively exposing the portions of the drain electrodes D in the R, G and B sub-pixel areas are formed in the first passivation layer PAS1 by etching the first passivation layer PAS1 exposed via the fourth photo resist pattern and removing the fourth photo resist pattern. The first passivation layer PAS1 may be made of low dielectric organic material such as polyanionic cellulose (PAC).

Figure 11A:
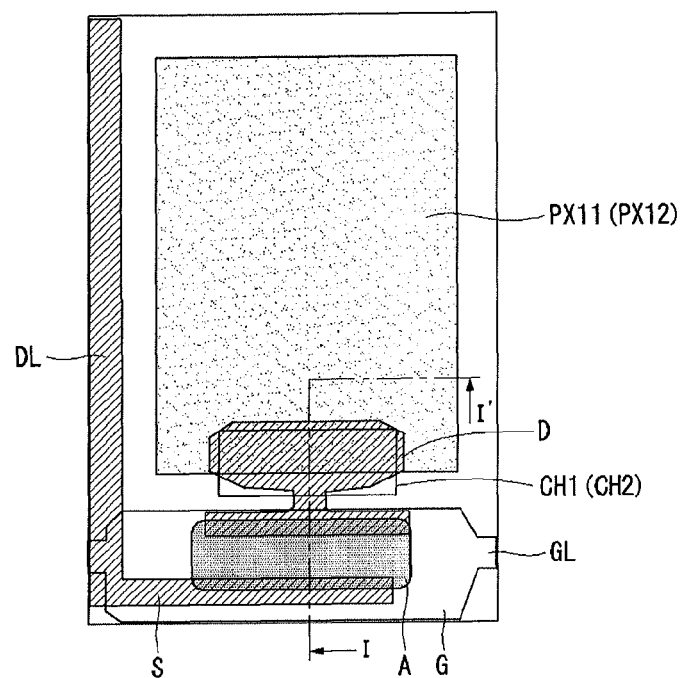
FIG. 11A is a top plan view illustrating a fifth mask process for manufacturing the touch sensor integrated type display device according to an embodiment of the invention.
Figure 11A:
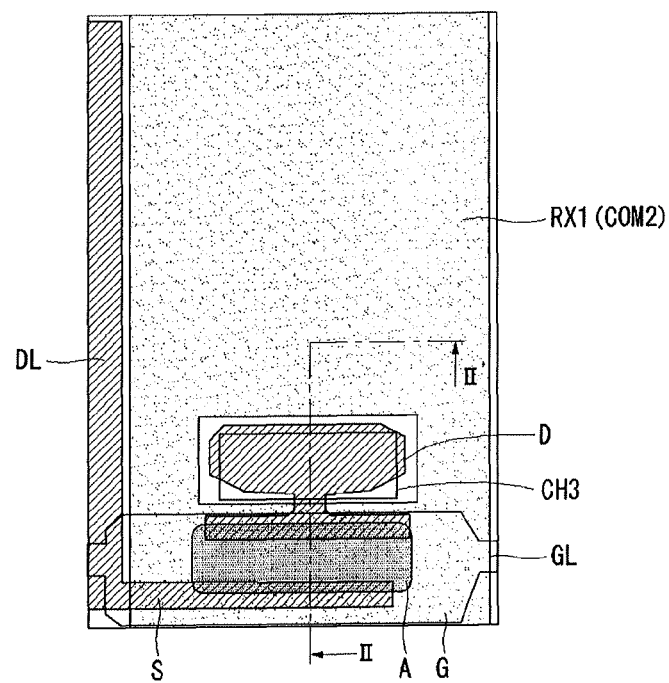
Figure 11B:
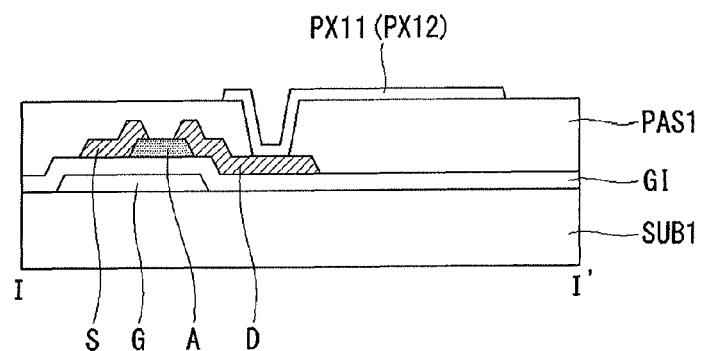
FIG. 11B is a cross-sectional view taken along lines I-I' and II-II' shown in FIG. 11A.
Figure 11B:
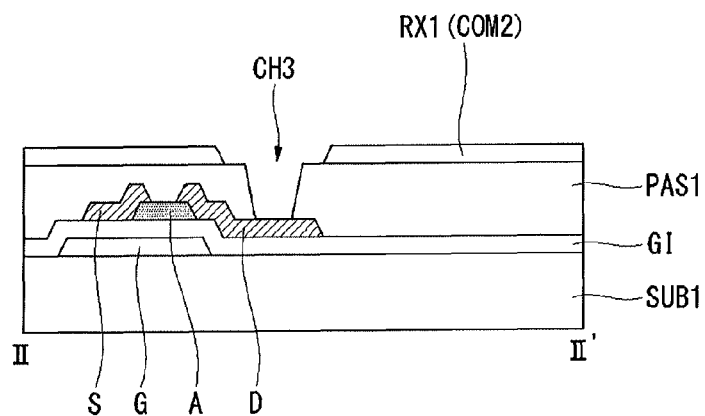

FIG. 11A is a top plan view illustrating a fifth mask process for manufacturing the touch sensor integrated type display device according to one embodiment of the invention, and FIG. 11B is a cross-sectional view taken along lines I-I' and II-II' shown in FIG. 11A.

Referring to FIGS. 11A and 11B, a first transparent conductive layer is formed as a third conductive layer on the first passivation layer PAS1 in which the first, second, and third contact holes CH1, CH2, and CH3 are formed through a deposition process. Then, a R sub-pixel electrode PX11, a G sub-pixel electrode PX12 and a second common electrode COM2 are formed by etching the first transparent conductive layer using a fifth mask process. As discussed above, the second common electrode COM2 may also serve as a touch sensing electrode RX1.

More specifically, a first transparent conductive layer is formed as a third conductive layer on the first passivation layer 125 in which the first and second contact holes CH1 and CH2 are formed through a deposition process, e.g., through a plasma-enhanced chemical vapor deposition (PECVD). A photo resist is formed on the first transparent conductive layer, and a fifth photo resist pattern (not shown) is formed through a photolithography process using a fifth mask. The fifth photo resist pattern exposes regions of the first transparent conductive layer excluding (e.g., except at) regions on which a R sub-pixel electrode PX11, a G sub-pixel electrode PX12 and a touch sensing electrode RX1 are to be formed. The R sub-pixel electrode PX11, the G sub-pixel electrode PX12 and the touch sensing electrode RX1 (the second common electrode COM2) are formed by etching the first transparent conductive layer exposed via the fifth photo resist pattern and removing the fifth photo resist pattern remaining on the first transparent conductive layer. The R sub-pixel electrode PX11 is connected with the drain electrode D exposed through the first contact hole CH1 formed in the first passivation layer PAS1, and the G sub-pixel electrode PX12 is connected with the drain electrode D exposed through the second contact hole CH2 formed in the first passivation layer PAS1. However the touch sensing electrode RX1 (the second common electrode COM2) is not connected with the drain electrode D exposed through the third contact hole CH3 formed in the first passivation layer PAS1. The first transparent conductive layer may be selected from transparent conductive material such as indium tin oxide (ITO), indium zinc oxide (IZO), and gallium-doped zinc oxide (GZO).

Figure 12A:
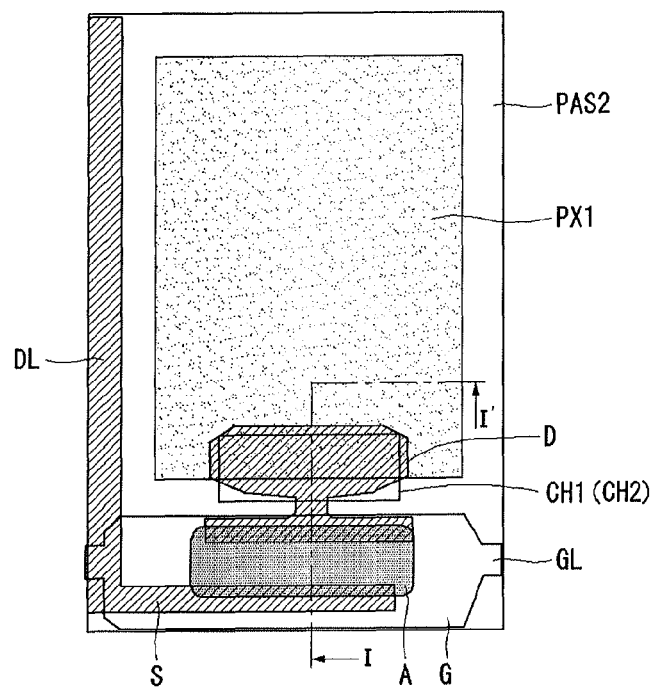
FIG. 12A is a top plan view illustrating a sixth mask process for manufacturing the touch sensor integrated type display device according to an embodiment of the invention.
Figure 12A:
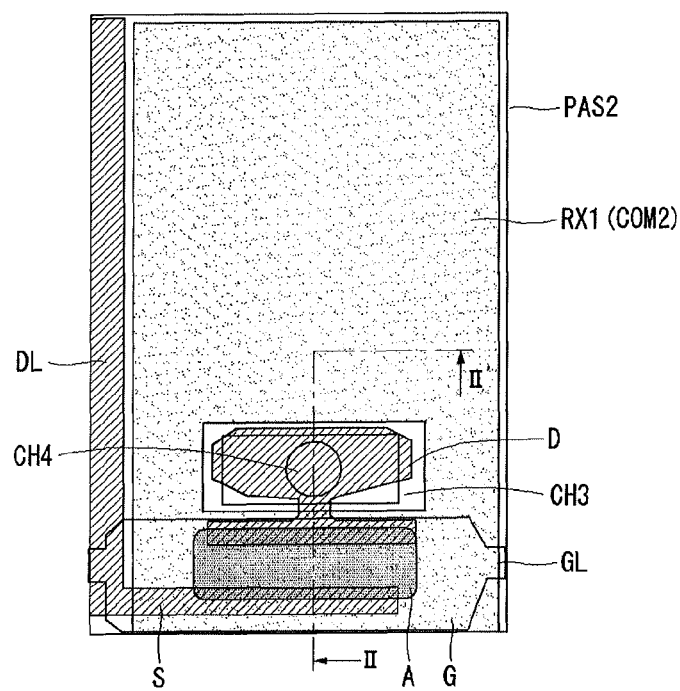
Figure 12B:
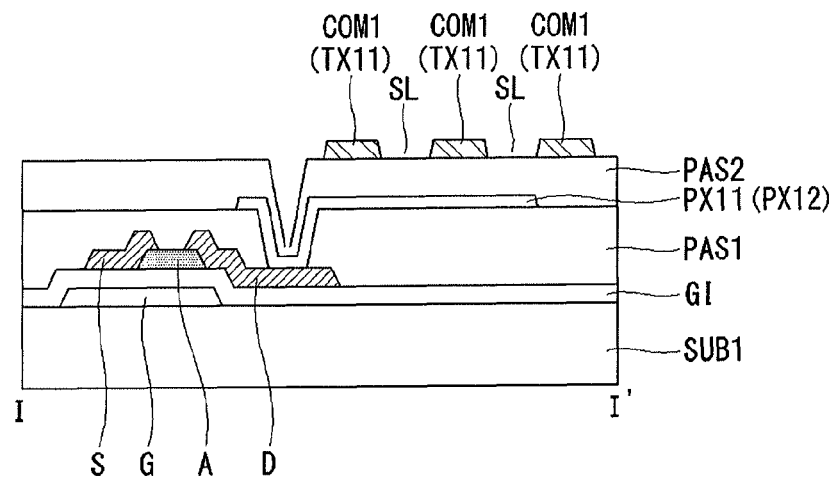
FIG. 12B is a cross-sectional view taken along lines I-I' and II-II' shown in FIG. 12A.
Figure 12B:
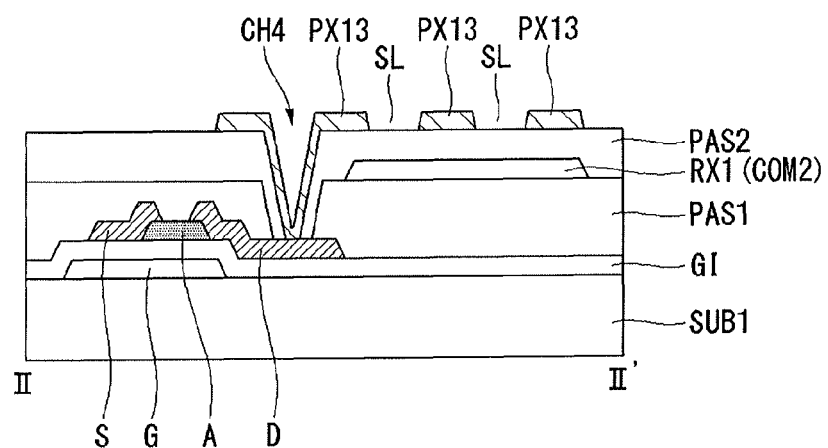

FIG. 12A is a top plan view illustrating a sixth mask process for manufacturing the touch sensor integrated type display device according to one embodiment of the invention, and FIG. 12B is a cross-sectional view taken along lines I-I' and II-II' shown in FIG. 12A.

Referring to FIGS. 12A and 12B, a second passivation layer PAS2 is formed on the first passivation layer PAS1 on which the R sub-pixel electrode PX11, the G sub-pixel electrode PX12 and the touch sensing electrode RX1 (the second common electrode COM2) are formed. Then a fourth contact hole CH4 is formed in the second passivation layer PAS2 to expose a portion of the drain electrode in the B sub-pixel area by etching the second passivation layer PAS2 using a sixth mask process.

More specifically, a second passivation layer PAS2 is formed on the first passivation layer PAS1 on which the R sub-pixel electrode PX11, the G sub-pixel electrode PX12 and the touch sensing electrode RX1 (the second common electrode COM2) are formed. A photo resist is entirely formed on the first passivation layer PAS2, and a sixth photo resist pattern (not shown) is formed to expose a portion of the drain electrode D in B sub-pixel area through a photolithography process using a sixth mask. And then a fourth contact hole CH4 exposing a portion of the drain electrodes D in the B sub-pixel area is formed in the second passivation layer PAS2 by etching the second passivation layer PAS2 exposed via the sixth photo resist pattern and removing the sixth photo resist pattern. The second passivation layer PAS2 may be made of low dielectric organic material such as polyanionic cellulose (PAC).

The fourth contact hole CH4 is formed overlap with the third contact hole CH3 formed during the fourth mask process. However, the third and fourth contact holes CH3 and CH4 may alternatively be formed at one time by removing portions of the first and second passivation layer PAS1 and PAS2 through the sixth mask process, e.g., without forming the third contact hole CH3 during the fourth mask process.

Figure 13A:
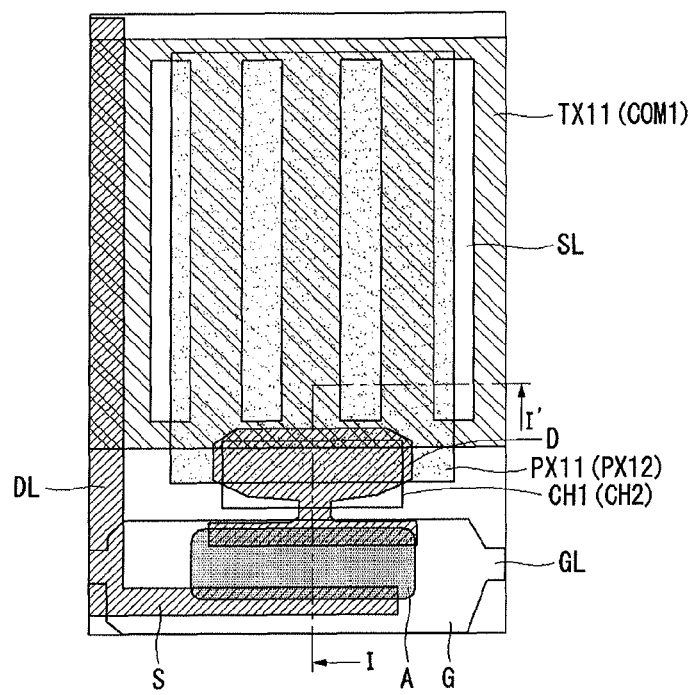
FIG. 13A is a top plan view illustrating a seventh mask process for manufacturing the touch sensor integrated type display device according to an embodiment of the invention.
Figure 13A:
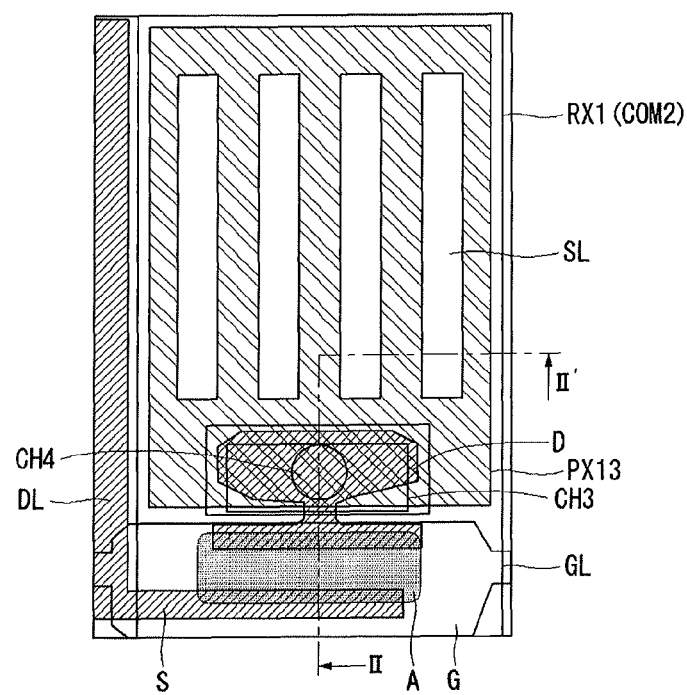
Figure 13B:
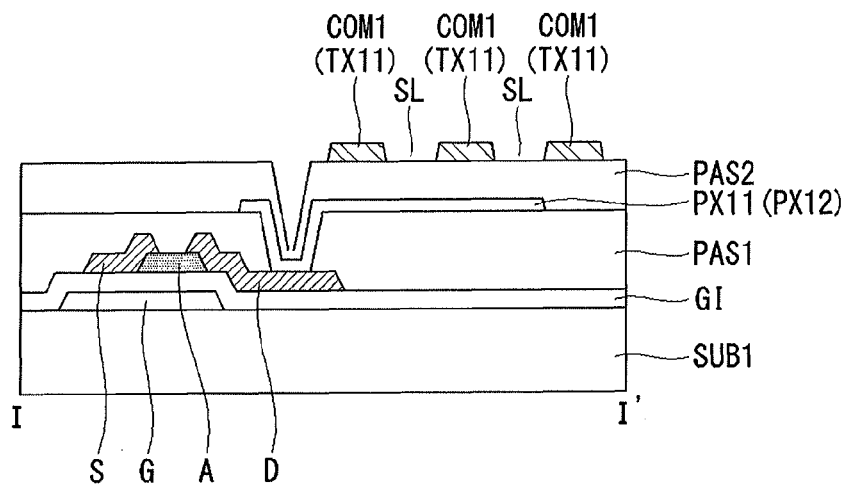
FIG. 13B is a cross-sectional view taken along lines I-I' and II-II' shown in FIG. 13A.
Figure 13B:
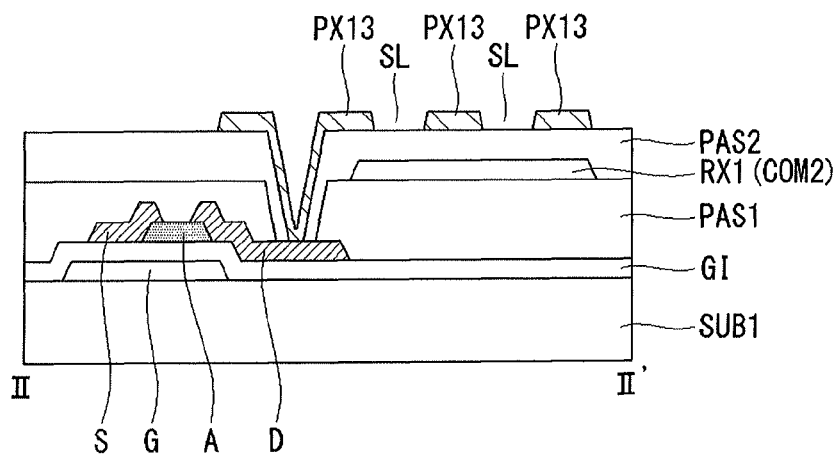

FIG. 13A is a top plan view illustrating a seventh mask process for manufacturing the touch sensor integrated type display device according to one embodiment of the invention, and FIG. 13B is a cross-sectional view taken along lines I-I' and II-II' shown in FIG. 13A.

Referring to FIGS. 13A and 13B, a second transparent conductive layer is formed as a fourth conductive layer on the second passivation layer PAS2 in which the fourth contact hole CH4 is formed. Then, a touch driving electrode TX11 and a B sub-pixel electrode PX13 are formed by etching the second transparent conductive layer using a seventh mask process. The touch driving electrode TX11 serves as a first common electrode COM1.

More specifically, a second transparent conductive layer is formed as a fourth conductive layer on the second passivation layer PAS2 in which the fourth contact hole CH4 is formed through a deposition process, such as a plasma-enhanced chemical vapor deposition (PECVD). A photo resist is formed on the second transparent conductive layer, and a seventh photo resist pattern (not shown) is formed through a photolithography process using a seventh mask. The seventh photo resist pattern exposes regions of the second transparent conductive layer excluding (e.g., except for) regions on which the touch driving electrodes TX11 (the first common electrode COM1) in the R and G sub-pixel areas and the sub-pixel electrode PX13 in the B sub-pixel area are to be formed. The touch driving electrodes TX11 (the first common electrode COM1) and the sub-pixel electrode PX13 are formed by etching the second transparent conductive layer exposed via the seventh photo resist pattern and removing the seventh photo resist pattern remaining on the second transparent conductive layer. The B sub-pixel electrode PX13 is connected with the drain electrode D exposed through the third and fourth contact holes CH3 and CH4 formed in the first and second passivation layer PAS1 and PAS2. The second transparent conductive layer may be selected from transparent conductive material such as indium tin oxide (ITO), indium zinc oxide (IZO), and gallium-doped zinc oxide (GZO).

According to the touch sensor integrated type display device and the method of manufacturing the same, it may be unnecessary to independently form the touch sensing electrodes for touch driving operation because the common electrode for driving the display device can serve as touch sensing electrodes. Put another way, the common electrode in the display device may function, operate, and/or serve as both a common electrode and a touch electrode (e.g., a touch driving electrode or touch sensing electrode). The common electrode may operate as a common electrode when supplied with Vcom and operate as a touch driving electrode when supplied with Vtsp. The common electrode may operate as a touch sensing electrode during a touch operation. Accordingly, it is possible to remove the process for forming the independent touch sensing electrodes, thereby lessening a thickness of the display device by as much as the thickness of the touch sensing electrode.

Thus, in the touch sensor integrated type display device according to one or more embodiments of the present invention, each touch driving electrode is formed to correspond to two types of sub-pixel electrodes (for example, R and G sub-pixel electrodes), and each touch sensing electrode is formed to correspond to one type of sub-pixel electrode (for example, B sub-pixel electrode). However this invention is not limited thereto and alternate variations are contemplated.

For instance, it is possible to form the touch driving electrode and the touch sensing electrode to correspond to multiple, several, or a few dozen of sub-pixel electrodes in some implementations. As a result, the touch driving and sensing electrodes are formed to correspond to the appropriate number of the sub-pixel electrodes. Also, it is possible to enhance touch sensibility by increasing mutual capacitance between touch driving electrodes and touch sensing electrodes by increasing the number of the touch driving and sensing electrodes.

Moreover, in the touch sensor integrated type display device according to one or more embodiments of this invention, the touch driving and sensing electrodes may be grouped using routing wires which connect the touch driving and sensing electrodes to the touch recognition processor 17. That is, grouping the touch driving and sensing electrodes may be simplified because one routing wire can connect several to hundreds of the touch driving electrodes or the touch sensing electrodes to each other. Accordingly, it is possible to adjust a size of a touch unit pixel.

While the invention has been described with respect to a limited number of embodiments, those skilled in the art, having benefit of the above description, will appreciate that other embodiments can be devised which do not depart from the scope of the invention as disclosed herein. In the description of the touch sensor integrated type display device according to the embodiment of the invention, although it is described that the touch unit pixel consists of R, G and B type sub-pixel electrodes, the first common electrode COM1 being opposite to the R and G sub-pixel electrodes and serving as the touch driving electrodes, and the second common electrode COM2 being opposite to the B sub-pixel electrodes and serving as the touch sensing electrodes, the invention is not limited thereto.

For instance, the first common electrode COM1 may be opposite to the R sub-pixel electrode, and the second common electrode COM2 may be opposite to the G and B sub-pixel electrodes. Or otherwise, the first common electrode COM1 may be opposite to the G and B sub-pixel electrodes, and the second common electrode COM2 may be opposite to the R sub-pixel electrode. Alternatively, the first common electrode COM1 may be opposite to first R, G and B sub-pixel electrodes, and the second common electrode COM2 may be opposite to next R, G and B sub-pixel electrodes which are neighboring to the first R, G and B sub-pixel electrodes.

Also, the touch unit pixel may consist of R (red color), G (green color), B (blue color) and W (white color) sub-pixel electrodes. The first and second common electrodes COM1 and COM2 may be disposed to correspond to the R, G, B and W sub-pixel electrodes in a variety of ways. Accordingly, the scope of the invention should be limited only by the attached claims.

What is claimed is:

1. A display device comprising:
   a plurality of first electrodes arranged in parallel on a first layer, where the plurality of first electrodes operate as a common electrode or a first touch electrode depending on a voltage applied to the first plurality of electrodes;
   a plurality of first sub-pixel electrodes disposed on at least one side of the first electrode on the first layer, and spaced from the first electrode;
   a plurality of second electrodes arranged in parallel on a second layer, where the plurality of second electrodes operate as a common electrode or a second touch electrode depending on a voltage applied to the second plurality of electrodes; and
   a plurality of second sub-pixel electrodes disposed on at least one side of the second electrode on the second layer, and spaced from the second electrode,
   wherein the plurality of first electrodes form a plurality of electrode lines arranged in a first direction, and each of the plurality of first electrodes overlaps with at least one of the plurality of second sub-pixel electrodes, and
   wherein the plurality of second electrodes form a plurality of electrode lines arranged in a second direction crossing over the first direction, and each of the plurality of second electrodes overlaps with at least one of the plurality of first sub-pixel electrodes.

2. The display device of claim 1, further comprising:
   a power supply unit configured to:
      supply a common voltage to the plurality of first electrodes and the plurality of second electrodes during a display operation; and
      supply a touch driving voltage to the plurality of second electrodes during a touch operation.

3. The display device of claim 1, further comprising:
   a power supply unit configured to:
      supply a common voltage to the plurality of first electrodes and the plurality of second electrodes during a display operation; and
      supply a touch driving voltage to the plurality of first electrodes during a touch operation.

4. The display device of claim 1, wherein one of the first electrode and the second sub-pixel electrode opposite to each other has a plurality of slits, and one of the second electrode and the first sub-pixel electrode opposite to each other has a plurality of slits.

5. The display device of claim 1, wherein the plurality of first sub-pixel electrodes include a red (R) sub-pixel electrode and a green (G) sub-pixel electrode, and the plurality of second sub-pixel electrodes include a blue (B) sub-pixel electrode, and
   wherein at least one of the plurality of first electrodes is disposed to be opposite to the R and G sub-pixel electrodes and at least one of the plurality of second electrodes is disposed to be opposite to the B sub-pixel electrode.

6. The display device of claim 1, wherein the plurality of first sub-pixel electrodes includes a R sub-pixel electrode, and the plurality of second sub-pixel electrodes includes a G sub-pixel electrode and B sub-pixel electrode, and
   wherein at least one of the plurality of first electrodes is disposed to be opposite to the R sub-pixel electrode, and at least one of the plurality of second electrodes is disposed to be opposite to the G and B sub-pixel electrodes.

7. The display device of claim 1, wherein the plurality of first sub-pixel electrodes includes a B sub-pixel electrode and a R sub-pixel electrode, and the plurality of second sub-pixel electrodes includes a G sub-pixel electrode, and
   wherein at least one of the plurality of first electrodes is disposed to be opposite to the B and R sub-pixel electrodes and at least one of the plurality of second electrodes is disposed to be opposite to the G sub-pixel electrode.

8. The display device of claim 1, wherein the plurality of first sub-pixel electrodes includes a G sub-pixel electrode, and the plurality of second sub-pixel electrodes includes a B sub-pixel electrode and R sub-pixel electrode, and
   wherein at least one of the plurality of first electrodes is disposed to be opposite to the G sub-pixel electrode, and at least one of the plurality of second electrodes is disposed to be opposite to the B and R sub-pixel electrodes.

9. The display device of claim 1, wherein the plurality of first sub-pixel electrodes includes a G sub-pixel electrode and a B sub-pixel electrode, and the plurality of second sub-pixel electrodes includes a R sub-pixel electrode, and
   wherein at least one of the plurality of first electrodes are formed is disposed to be opposite to the G and B sub-pixel electrodes, and at least one of the plurality of second electrodes is disposed to be opposite to the R sub-pixel electrode.

10. A display device comprising:
    a plurality of gate lines disposed on a substrate in parallel to each other;
    a gate insulation layer covering the plurality of gate lines;
    a plurality of data lines disposed on the insulation layer to cross over the gate lines;

a transistor disposed in each of a plurality of pixel areas defined by crossing of the gate lines and the data lines;

a first passivation layer covering the gate insulation on which the transistor is formed;

a first sub-pixel electrode disposed on a first passivation layer in a first pixel area of the plurality of pixel areas;

a first electrode disposed on the first passivation layer in a second pixel area of the plurality of pixel areas, where the first electrode operates as either a common electrode or a first touch electrode;

a second passivation layer covering the first passivation layer on which the first sub-pixel electrode and the first electrode are formed;

a second electrode disposed on the second passivation layer in the first pixel area, where the second electrode operates as either a common electrode or a second touch electrode; and a second sub-pixel electrode disposed on the second passivation layer in the second pixel area, wherein the first sub-pixel electrode is connected with the transistor in the first sub-pixel area via a first contact hole passing through the first passivation layer, the second sub-pixel electrode is connected with the transistor in the second sub-pixel area via a second contact hole passing through the first and second passivation layers, and the first electrode is disposed to be opposite to the second sub-pixel electrode and the second electrode is disposed to be opposite to the first sub-pixel electrode.

11. The display device of claim 10, wherein a common voltage is supplied to the first electrode and the second electrode during a display operation, and a touch driving voltage is supplied to one of the first and second electrodes during a touch operation.

12. The display device of claim 11, wherein when the touch driving voltage is supplied to one of the first and second electrodes during the touch operation, the first and second electrode are part of a touch unit pixel capable of recognizing a touch of the display device.

13. The display device of claim 10, wherein one of the first electrode and the second sub-pixel electrode has a plurality of slits, and one of the second electrode and the first sub-pixel electrode has a plurality of slits.

14. The display device of claim 10, wherein the first sub-pixel electrode includes a R sub-pixel electrode and a G sub-pixel electrode, and the second sub-pixel electrode includes a B sub-pixel electrode, and wherein the first electrode is disposed to be opposite to the R and G sub-pixel electrodes and the second electrode is disposed to be opposite to the B sub-pixel electrode.

15. The display device of claim 10, wherein the first sub-pixel electrode includes a R sub-pixel electrode, and the second sub-pixel electrode includes a G sub-pixel electrode and B sub-pixel electrode, and wherein the first electrode is disposed to be opposite to the R sub-pixel electrode, and the second electrode is disposed to be opposite to the G and B sub-pixel electrodes.

16. The display device of claim 10, wherein the first sub-pixel electrode includes a B sub-pixel electrode and a R sub-pixel electrode, and the second sub-pixel electrode includes a G sub-pixel electrode, and wherein the first electrode is disposed to be opposite to the B and R sub-pixel electrodes and the second electrode is disposed to be opposite to the G sub-pixel electrode.

17. The display device of claim 10, wherein the first sub-pixel electrode includes a G sub-pixel electrode, and the second sub-pixel electrode includes a B sub-pixel electrode and R sub-pixel electrode, and wherein the first electrode is disposed to be opposite to the G sub-pixel electrode, and the second electrode is disposed to be opposite to the B and R sub-pixel electrodes.

18. A method of manufacturing a display device comprising:

forming a first conductive layer on a substrate, and forming a gate line and a gate electrode using first mask process;

forming a gate insulation on the substrate on which the gate line and the gate electrode are formed, forming a semiconductor layer on the gate insulation, and forming a semiconductor pattern on a region of the gate insulation layer corresponding to the gate electrode by patterning the semiconductor layer using a second mask process;

forming a data metal layer as a second conductive layer on the gate insulation layer, and forming first conductive pattern group including a data line, a source electrode extended from the data line and a drain electrode opposite to the source electrode by pattering the data metal layer using a third mask process;

forming a first passivation layer on an surface of the gate insulation layer on which the first conductive pattern group is formed, and forming a first contact hole which exposes a portion of each the drain electrode in first and second sub-pixel areas by etching the first passivation layer using a fourth mask process;

forming a first transparent conductive layer as a third conductive layer on the first passivation layer in which the first and second contact holes are formed, and forming a first sub-pixel electrode in the first pixel area and a first electrode in the second pixel area by patterning the first transparent conductive layer using a fifth mask process;

forming a second passivation layer on the first passivation layer on which the first sub-pixel electrode and the first electrode are formed, and forming a third contact hole in the second passivation to expose a portion of the drain electrode in the second pixel area by etching the second passivation layer using a sixth mask process; and forming a second transparent conductive layer as a fourth conductive layer on the second passivation layer in which the third contact hole is formed, and forming a second electrode in the first pixel area and a second sub-pixel electrode in the second pixel area by etching the second transparent conductive layer using a seventh mask process, wherein the first electrode is formed to be opposite to the second sub-pixel electrode and the second electrode is formed to be opposite to the first sub-pixel electrode.

19. The method of claim 18, wherein the first sub-pixel electrode includes a R sub-pixel electrode and a G sub-pixel electrode, and the second sub-pixel electrode includes a B sub-pixel electrode, and wherein the first electrode is formed to be opposite to the R and G sub-pixel electrodes and second electrode is formed to be opposite to the B sub-pixel electrode.

20. The method of claim 18, wherein the first and second conductive layers are selected from Cu, CuOx, Al, AlNd, Mo, MoTi, and Cr, and the first and second transparent conductive layers are selected from indium tin oxide (ITO), indium zinc oxide (IZO), and gallium-doped zinc oxide (GZO).

* * * * *